(12) United States Patent
Zhang et al.

(10) Patent No.: US 12,147,636 B2
(45) Date of Patent: Nov. 19, 2024

(54) DISPLAY SUBSTRATE, DISPLAY PANEL AND DISPLAY DEVICE

(71) Applicants: Nanjing BOE Display Technology Co., LTD, Jiangsu (CN); BOE Technology Group Co., Ltd., Beijing (CN)

(72) Inventors: Tian Zhang, Beijing (CN); Honggang Gu, Beijing (CN); Xianna Wang, Beijing (CN); Zhuqing Xu, Beijing (CN); Chaoping Wen, Beijing (CN); Guangye Hao, Beijing (CN)

(73) Assignees: Nanjing BOE Display Technology Co., LTD, Nanjing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/801,566

(22) PCT Filed: Oct. 27, 2021

(86) PCT No.: PCT/CN2021/126604
§ 371 (c)(1),
(2) Date: Aug. 23, 2022

(87) PCT Pub. No.: WO2023/070354
PCT Pub. Date: May 4, 2023

(65) Prior Publication Data
US 2024/0143119 A1    May 2, 2024

(51) Int. Cl.
*G06F 3/044*    (2006.01)
*G06F 3/041*    (2006.01)
*G02F 1/1333*   (2006.01)

(52) U.S. Cl.
CPC .......... *G06F 3/0446* (2019.05); *G06F 3/0412* (2013.01); *G06F 3/04164* (2019.05);
(Continued)

(58) Field of Classification Search
CPC .. G06F 3/0446; G06F 3/04164; G06F 3/0412; G06F 3/0418; G06F 2203/04107; G02F 1/13338
See application file for complete search history.

(56) References Cited

U.S. PATENT DOCUMENTS 10,067,620 B2    9/2018   Xie et al.
10,866,662 B2    12/2020  Wang et al.
(Continued)

FOREIGN PATENT DOCUMENTS

CN    105389065 A    3/2016
CN    105677086 A    6/2016
(Continued)

*Primary Examiner* — Peter D McLoone
(74) *Attorney, Agent, or Firm* — Westman, Champlin & Koehler, P.A.

(57) ABSTRACT

A display substrate, a display panel and a display device are provided. The display substrate includes: a base substrate; a plurality of sub-pixels arranged in an array on the base substrate, wherein at least one sub-pixel includes a first electrode, the first electrodes of the sub-pixels in one of two adjacent rows of sub-pixels extend in a first direction, and the first electrodes of the sub-pixels in the other one of the two adjacent rows of sub-pixels extend in a second direction intersecting with the first direction; and a touch electrode and a plurality of touch lines, wherein the touch electrode includes a plurality of touch units, one touch unit is connected to at least one touch line, and different touch units are connected to different touch lines; and wherein each touch unit covers an even number of rows of sub-pixels.

20 Claims, 11 Drawing Sheets

(52) U.S. Cl.
CPC ........ *G02F 1/13338* (2013.01); *G06F 3/0418* (2013.01); *G06F 2203/04107* (2013.01)

(56) References Cited

U.S. PATENT DOCUMENTS

| | | | |
|---|---|---|---|
| 11,513,623 | B2 | 11/2022 | Wang et al. |
| 11,749,147 | B2* | 9/2023 | Lee ................... G06F 3/04166 345/173 |
| 2014/0267955 | A1* | 9/2014 | Hibayashi ......... G02F 1/133514 349/12 |
| 2016/0062499 | A1 | 3/2016 | Pedder et al. |
| 2018/0046274 | A1 | 2/2018 | Xie et al. |
| 2018/0196544 | A1 | 7/2018 | Wang et al. |
| 2021/0247867 | A1 | 8/2021 | Wang et al. |
| 2022/0101765 | A1* | 3/2022 | Lee ................... G06F 3/0446 |
| 2022/0137755 | A1 | 5/2022 | Liu et al. |
| 2022/0342500 | A1 | 10/2022 | Su et al. |

FOREIGN PATENT DOCUMENTS

| | | | |
|---|---|---|---|
| CN | 106990869 | A | 7/2017 |
| CN | 107479756 | A | 12/2017 |
| TW | 1621972 | B | 4/2018 |
| WO | 2021087650 | A1 | 5/2021 |
| WO | 2021189489 | A1 | 9/2021 |
| WO | 2021196871 | A1 | 10/2021 |

* cited by examiner

DISPLAY SUBSTRATE, DISPLAY PANEL AND DISPLAY DEVICE

CROSS REFERENCE TO RELATED APPLICATION(S)

This application is a Section 371 National Stage Application of International Application No. PCT/CN2021/126604, filed on Oct. 27, 2021, entitled "DISPLAY SUBSTRATE, DISPLAY PANEL AND DISPLAY DEVICE", the disclosure of which is incorporated herein by reference in its entirety.

TECHNICAL FIELD

The present disclosure relates to a field of display technology, and in particular to a display substrate, a display panel and a display device.

BACKGROUND

With a development of the display technology, In-cell technology has been widely used in a display substrate. The display substrate using In-cell technology may perform display and touch control in a time-sharing manner, thereby realizing an integration of display and touch control.

SUMMARY

The present disclosure provides a display substrate, a display panel and a display device.

According to a first aspect of the present disclosure, there is provided a display substrate, including:
a base substrate;
a plurality of sub-pixels arranged in an array on the base substrate, wherein at least one of the plurality of sub-pixels includes a first electrode, the first electrodes of the sub-pixels in one of two adjacent rows of sub-pixels extend in a first direction, and the first electrodes of the sub-pixels in the other one of the two adjacent rows of sub-pixels extend in a second direction intersecting with the first direction; and
a touch electrode and a plurality of touch lines, wherein the touch electrode includes a plurality of touch units, one of the plurality of touch units is connected to at least one of the plurality of touch lines, and different touch units are connected to different touch lines; and
wherein each touch unit covers an even number of rows of sub-pixels.

According to embodiments of the present disclosure, the plurality of touch units are arranged in an array, and touch units in the same row cover the same number of rows of sub-pixels.

According to embodiments of the present disclosure, the number of rows of sub-pixels covered by each row of touch units is the same as the number of rows of sub-pixels covered by another row of touch units.

According to embodiments of the present disclosure, the number of rows of sub-pixels covered by each of at least two rows of the touch units is different from the number of rows of sub-pixels covered by another one of at least two rows of the touch units.

According to embodiments of the present disclosure, the number of rows of sub-pixels covered by at least one row of first to $n^{th}$ rows of touch units is different from the number of rows of sub-pixels covered by at least one row of $(n+1)^{th}$ to $m^{th}$ rows of touch units; and/or, the number of rows of sub-pixels covered by at least one row of $(n+1)^{th}$ to $m^{th}$ rows of touch units is different from the number of rows of sub-pixels covered by at least one row of $(m+1)^{th}$ to a $N^{th}$ rows of touch units; and wherein N is a total number of the rows of touch units, each of m and n is an integer, and $1 \leq n < m < N$.

According to embodiments of the present disclosure, $$21\% \geq \frac{n}{m} \geq 2\%;$$

and/or, $$16\% \geq \frac{n}{N} \geq 3\%;$$

and/or, $$97\% \geq \frac{m}{N} \geq 75\%.$$

According to embodiments of the present disclosure, the plurality of touch units satisfies:
y<x and y<z; or, y≥x and y<z; or y>x and y>z;
wherein, x is the number of rows of sub-pixels covered by the at least one row of the first to $n^{th}$ rows of touch units, y is the number of rows of sub-pixels covered by the at least one row of the $(n+1)^{th}$ to $m^{th}$ rows of touch units, z is the number of rows of sub-pixels covered by the at least one row of the $(m+1)^{th}$ to $N^{th}$ rows of touch units.

According to embodiments of the present disclosure, the number of rows of sub-pixels covered by one of two adjacent rows of the $(n+1)^{th}$ to $m^{th}$ rows of touch units is different from the number of rows of sub-pixels covered by the other one of the two adjacent rows of the $(n+1)^{th}$ to $m^{th}$ rows of touch units.

According to embodiments of the present disclosure, the number of rows of sub-pixels covered by the $N^{th}$ row of touch units is different from the number of rows of the sub-pixels covered by any other row of touch units.

According to embodiments of the present disclosure, the number of columns of sub-pixels covered by each touch unit is the same as the number of columns of sub-pixels covered by another touch unit; or,
the number of columns of sub-pixels covered by at least one touch unit in at least one row of the $(m+1)^{th}$ to $N^{th}$ rows of the touch units is different from the number of columns of sub-pixels covered by the touch unit in any other row of the $(m+1)^{th}$ to $N^{th}$ rows of touch units.

According to embodiments of the present disclosure, more than one touch units in at least one row of the $(m+1)^{th}$ to $N^{th}$ rows include:
at least one first touch unit and at least one second touch unit, an orthographic projection of the first touch unit on the base substrate is different from an orthographic projection of the second touch unit on the base substrate; wherein the number of columns of sub-pixels covered by the first touch unit is different from the number of columns of sub-pixels covered by the second touch unit, and the number of columns of sub-pixels covered by the first touch unit is different from the number of columns of sub-pixels covered by the touch unit in any other row of touch units.

According to embodiments of the present disclosure, the number of rows of sub-pixels covered by one of two adjacent rows of touch units is c, and the number of rows of sub-pixels covered by the other one of the two adjacent rows of touch units is d, wherein c is less than d, and $$\frac{c}{d} \geq 80\%.$$

According to embodiments of the present disclosure, an area of each touch unit in one of two adjacent rows of touch units is large than e, an area of each touch unit in the other one of the two adjacent rows of touch units is large than f, wherein e is less than f, and $$\frac{e}{f} \geq 92\%.$$

According to embodiments of the present disclosure, the first electrode of at least one sub-pixel includes a plurality of strip electrodes, and the plurality of strip electrodes of the same sub-pixel extend in substantially the same direction.

According to embodiments of the present disclosure, at least one touch unit includes a plurality of touch blocks, each touch block corresponds to at least one sub-pixel, and different touch blocks correspond to different sub-pixels;
the touch block is multiplexed as a second electrode of the sub-pixel corresponding to the touch block, wherein the first electrode and the second electrode form a driving electrode of the sub-pixel; and
wherein the touch block is in form of a flat plate.

According to embodiments of the present disclosure, a preset angle is formed between the first direction and the second direction, such that:
the drive electrodes of the sub-pixels in one of two adjacent rows of sub-pixels are allowed to form a first domain electric field, and the driving electrodes of the sub-pixels in the other one of the two adjacent rows of sub-pixels are allowed to form a second domain electric field, wherein a direction of the first domain electric field is different from a direction of the second domain electric field.

According to embodiments of the present disclosure, the plurality of sub-pixels form a plurality of pixel units, one pixel unit including more than one sub-pixels in different colors;
the plurality of touch blocks in a same touch unit are divided into a plurality of groups, at least one group including more than one touch blocks, wherein the sub-pixels corresponding to the touch blocks in at least one group belong to a same pixel unit, and the touch blocks in a same group are connected to each other.

According to embodiments of the present disclosure, different groups of touch blocks are spaced by an interval, and the touch blocks belonging to different groups in a same touch unit are connected to each other by a first connection part.

According to embodiments of the present disclosure, the groups of touch blocks connected to the first connection part are arranged surrounding the first connection part.

According to embodiments of the present disclosure, the display substrate further includes a plurality of gate lines extending in a row direction, one row of sub-pixels are connected to one gate line, the touch electrode further includes a plurality of rows of first hollow structures, at least one row of the first hollow structures corresponds to at least one gate line, and different rows of first hollow structures correspond to different gate lines; and
an orthographic projection of at least one row of first hollow structures on the base substrate at least partially overlaps with an orthographic projection of the gate line corresponding to the at least one row of first hollow structure on the base substrate.

According to embodiments of the present disclosure, at least one sub-pixel further includes a thin film transistor connected to a data line;
the touch electrode further includes a plurality of second hollow structures, at least one second hollow structure corresponds to at least one sub-pixel, different second hollow structures correspond to different sub-pixels, and an orthographic projection of at least one second hollow structure on the base substrate at least partially overlaps with an orthographic projection of the thin film transistor of the sub-pixel corresponding to the second hollow structure on the base substrate.

According to embodiments of the present disclosure, the thin film transistor includes a semiconductor layer and a gate layer;
the semiconductor layer includes a first electrode connection part, a second electrode connection part and a channel part disposed between the first electrode connection part and the second electrode connection part, the channel part is disposed directly opposite to the gate layer, and the channel part is in form of a straight line.

According to embodiments of the present disclosure, the display substrate further includes a plurality of data lines extending in a column direction, and one column of the sub-pixels are connected to the same data line;
the sub-pixel includes a first side and a second side opposite to the first side, and an orthographic projection of at least one of the plurality of data lines on the base substrate is on the first side of an orthographic projection of the sub-pixels connected to at least one of the plurality of the data lines on the base substrate;
at least one of the plurality of data lines includes a plurality of segments, at least one of the plurality of segments includes a first part corresponding to an odd numbered row of sub-pixels and a second part corresponding to an even numbered row of sub-pixels, a direction along which the first part extends is substantially the same as a direction along which the first electrodes of the sub-pixels corresponding to the first part extend, and a direction along which the second part extends is substantially the same as a direction along which the first electrodes of the sub-pixels corresponding to the second part extend; and
two adjacent segments of at least one of the plurality of data lines are connected to each other by a second connection part, the second connection part is bended in a third direction directing from the second side of the sub-pixel to the first side of the sub-pixel.

According to embodiments of the present disclosure, at least one of the touch unit includes a plurality of touch blocks, the plurality of sub-pixels include a plurality of first sub-pixels capable of displaying a first color, the plurality of touch blocks in at least one touch unit include a plurality of first touch blocks, at least one first touch block corresponds to at least one first sub-pixel, and different first touch blocks correspond to different first sub-pixels;
at least one touch line includes a body part and a plurality of protrusions on a side of the body part, the plurality of protrusions are arranged along a length direction of the touch line, at least one protrusion corresponds to at least one first touch block, different protrusions correspond to different first touch blocks, and an orthographic projection of at least one protrusion on the base substrate at least partially overlaps with an orthographic projection of the first touch block corresponding to the at least one protrusion on the base substrate.

According to embodiments of the present disclosure, the touch electrode further includes a plurality of columns of third hollow structures, at least one column of third hollow structures corresponds to at least one touch line, and different columns of third hollow structures correspond to different touch lines;

at least one column of third hollow structures includes: a plurality of second hollow parts spaced from each other and arranged in a direction along which the third hollow structures extend, and a third hollow part disposed on a side of at least one second hollow part;

at least one third hollow part corresponds to at least one protrusion of the touch line corresponding to the at least one third hollow part, and different third hollow parts correspond to different protrusions;

an orthographic projection of at least one third hollow part on the base substrate at least partially overlaps with an orthographic projection of the protrusion corresponding to the at least one third hollow part on the base substrate; and an orthographic projection of at least one second hollow part on the base substrate at least partially overlaps with an orthographic projection of the body part of the touch line corresponding to the at least one second hollow part on the base substrate.

According to embodiments of the present disclosure, the display substrate further includes a plurality of gate lines extending in a row direction, and one row of sub-pixels are connected to the same gate line;

the touch electrode further includes a plurality of rows of first hollow structures, at least one row of first hollow structures corresponds to at least one gate line, different rows of first hollow structures correspond to different gate lines; an orthographic projection of at least one first hollow structure on the base substrate at least partially overlaps with an orthographic projection of the gate line corresponding to the at least first hollow structure on the base substrate; and for at least one column of third hollow structures, a $j^{th}$ third hollow structure is connected to the first hollow structure and spaced from the second hollow part, and a $(j+1)^{th}$ third hollow structure is spaced from the first hollow structure and connected to the second hollow structure, wherein j is a positive integer.

According to embodiments of the present disclosure, the touch line is disposed on a side of the touch block close to the base substrate;

the first touch blocks in at least one touch unit are arranged in an array, at least one first touch block in at least one column of first touch blocks in the touch unit is connected to the protrusion corresponding to the at least one first touch block through a via hole.

According to embodiments of the present disclosure, one of the first touch blocks in two adjacent rows is connected to the protrusion corresponding to the one of the first touch blocks through a via hole.

According to embodiments of the present disclosure, the first sub-pixel is a blue sub-pixel.

According to embodiments of the present disclosure, the first electrode of at least one sub-pixel includes a plurality of strip electrodes;

a length of at least one strip electrode of at least one first sub-pixel is less than a length of the plurality of strip electrodes of any other sub-pixel.

According to embodiments of the present disclosure, the plurality of sub-pixels are divided into a plurality of groups, at least one group of sub-pixels includes two adjacent rows of sub-pixels, and sub-pixels in different groups belong to different rows.

According to a second aspect of the present disclosure, a display panel including a display substrate as described above is provided.

According to a third aspect of the present disclosure, a display device including a display panel as described above is provided.

BRIEF DESCRIPTION OF THE DRAWINGS

The preceding and other objects, features and advantages of the present disclosure will become more apparent from the following description of the embodiments of the present disclosure with reference to the accompanying drawings, in which.

DETAILED DESCRIPTION OF EMBODIMENTS

Figure 1:
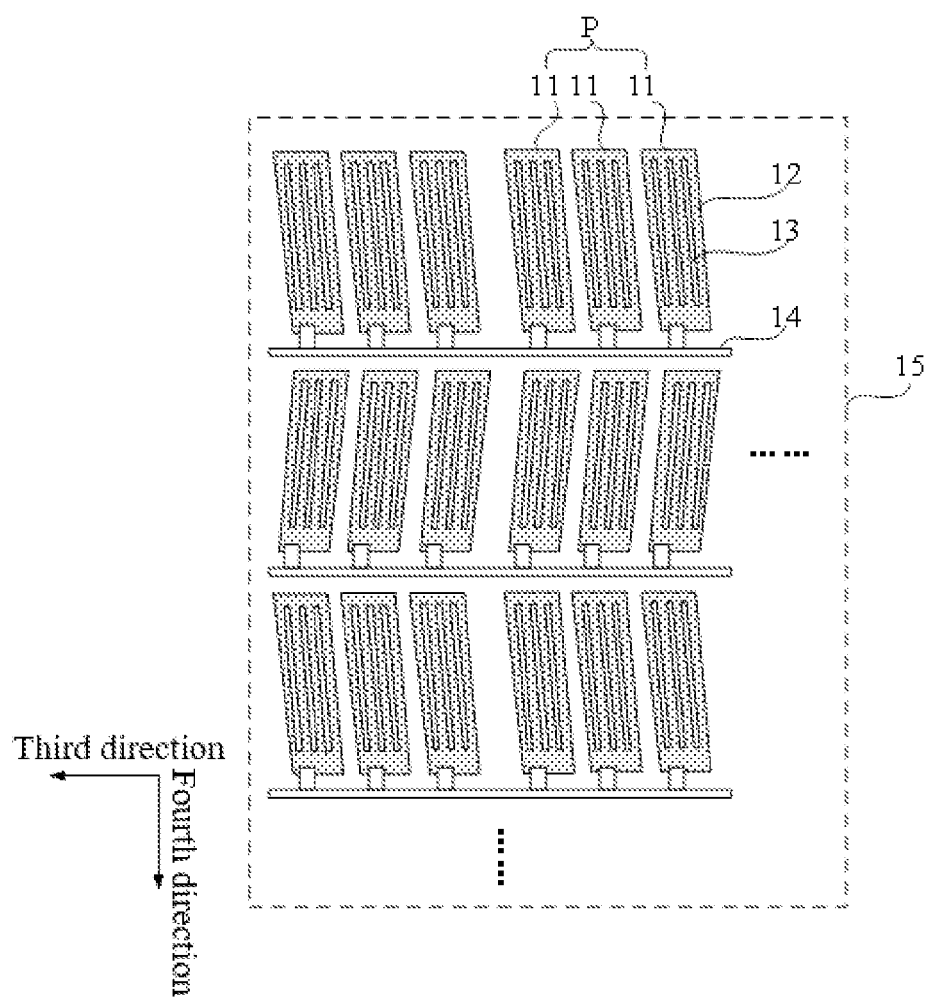
FIG. 1 schematically shows a schematic diagram of a display substrate in an example.

In order to make the objectives, technical solutions and advantages of the embodiments of the present disclosure more clear, the technical solutions of the embodiments of the present disclosure will be clearly and completely described below with reference to the accompanying drawings. Obviously, the described embodiments are some, but not all, embodiments of the present disclosure. Based on the described embodiments of the present disclosure, all of the other embodiments obtained by those of ordinary skill in the art without creative efforts fall within the protection scope of the present disclosure.

It should be noted that, in the drawings, a size and a relative size of the elements may be exaggerated for clarity and/or description. In this way, a dimension and a relative dimension of the various elements are not necessarily limited to those shown in the drawings. In the specification and drawings, a same or similar reference number refer to a same or similar part.

When an element is described as being "on", "connected to", or "coupled to" another element, the element may be directly on, directly connected to, or directly coupled to the other element, or intermediate elements may be existed. However, when an element is described as being "directly on", "directly connected to", or "directly coupled to" another element, there is no intermediate element existed. Other terms and/or expressions used to describe a relationship between elements should be interpreted in a similar fashion, e.g., "between" versus "directly between", "adjacent" versus "directly adjacent", or "on" versus "directly on" etc. Furthermore, the term "connected" may refer to a physical connection, an electrical connection, a communication connection, and/or a fluid connection. In addition, an X axis, a Y axis and a Z axis are not limited to a three axes of a rectangular coordinate system, and can be interpreted in a broader sense. For example, the X, Y, and Z axes may be perpendicular to each other, or may represent different directions that are not perpendicular to each other. For a purpose of this disclosure, "at least one of X, Y, and Z" and "at least one of the selected groups consisted of X, Y, and Z" may be interpreted as X only, Y only, Z only, or such as any combination of two or more of X, Y and Z in XYZ, XYY, YZ and ZZ. As used herein, the term "and/or" includes any and all combinations of one or more of the associated listed items.

It should be noted that, although the terms "first", "second", etc. may be used herein to describe various components, members, elements, regions, layers and/or parts, these components, members, elements, regions, layers and/or parts shall not be limited by these terms. Rather, these terms are used to distinguish one component, member, element, region, layer and/or part from another. Thus, for example, a first component, a first member, a first element, a first region, a first layer and/or a first part discussed below could be termed a second component, a second member, a second element, a second region, a second layer and/or a second part without departing from the teachings of the present disclosure.

For ease of description, a spatially relational term, e.g., "upper", "lower", "left", "right", etc. may be used herein to describe a relationship between one element or feature with another element or feature as shown in the drawings. It should be understood that the spatially relational term are intended to encompass other different orientations of the apparatus in use or operation in addition to an orientation depicted in the drawings. For example, if the apparatus in the drawings is turned over, the elements described as "below" or "beneath" the other elements or features would then be oriented "above" or "on" the other elements or features.

Those skilled in the art should understand that herein, unless otherwise specified, an expression "thickness" refers to a dimension of a surface of each film layer disposed along a direction perpendicular to the display substrate, i.e. a dimension of a direction along which a light exiting on the display substrate.

In the present disclosure, unless otherwise specified, an expression "patterning process" generally includes steps of photoresist coating, exposure, development, etching, and photoresist stripping. The expression "one-shot patterning process" means a process of using a mask to form a patterned layer, feature, member, etc.

It should be noted that the expressions "same layer", "disposed in the same layer" or similar expressions refer to a layer structure which is formed by forming a layer used to form a specific pattern by the same film-forming process, and then patterning the layer by using the same mask through an one-time patterning process. According to the difference between the specific patterns, the one-time patterning process may include multiple exposures, developments or etching processes, and the specific pattern in the formed layer structure may be continuous or discontinuous. It is also possible for these specific patterns to be located at different heights or have different thicknesses.

As used herein, unless otherwise stated, an expression "electrically connected" may mean that two components or elements are directly electrically connected to each other, e.g., a component or element A directly contacts with a component or element B, and electrical signals may be transmitted between the two components or elements A and B, it may also mean that two components or elements are electrically connected to each other by a conductive medium such as a conductive wire, for example, the component or element A is electrically connected to the component or element B by a conductive wire to transmit electrical signals between the two components or elements, and it may also mean that two components or elements are electrically connected by at least one electronic component, e.g., the component or component A is electrically connected to the component or component B by at least one thin film transistor to transmit electrical signals between the two components or elements A and B.

FIG. 1 schematically shows a schematic diagram of a display substrate in an example. As shown in FIG. 1, in the example, a base substrate is a liquid crystal display substrate, the base substrate adopts In-cell technology to realize the integration of display and touch. The display substrate includes a base substrate and a plurality of pixel units P disposed on the base substrate. Each pixel unit P includes a plurality of sub-pixels 11. The plurality of sub-pixels 11 may display a variety of colors, and different sub-pixels 11 display different colors. For example, each pixel unit P includes a red sub-pixel, a green sub-pixel and a blue sub-pixel. The display substrate is designed to have a sub-pixel structure of 2Pixel2Domain (2P2D). Each sub-pixel 11 includes a plurality of strip pixel electrodes 12, and the plurality of strip pixel electrodes 12 of each sub-pixel 11 are separated by a slit 13. The so called 2Pixel2Domain means that a direction along which the pixel electrodes 12 of one of two adjacent rows of sub-pixels 11 extend is different from a direction along which the pixel electrodes 12 of the other one of two adjacent rows of sub-pixels 11 extend, and the pixel electrodes 12 of each two adjacent rows of sub-pixels 11 are approximately symmetrical with respect to the gate lines 14. Therefore, in the display substrate, for, a first domain electric field may be formed by the pixel electrodes 12 and the common electrodes of the sub-pixels 11 in one of two adjacent rows, and a second domain electric field may be formed by the pixel electrodes 12 and the common electrodes of sub-pixels 11 in the other one of the two adjacent rows. A direction of the first domain electric field is different from a direction of the second domain electric field. In other words, the direction of the electric field corresponding to one of the two adjacent rows of sub-pixels 11 intersects with the direction of the electric field corresponding to the other one of the two adjacent rows of sub-pixels 11 by a specific angle. Accordingly, a light emitting direction of one of the two adjacent rows of sub-pixels 11 may compensate for a light emitting direction of the other one of the two adjacent rows of sub-pixels 11, which is beneficial to improve a display effect.

In the example, the display substrate further includes a touch electrode multiplexed as a common electrode of each sub-pixel. The touch electrode includes a plurality of touch units 15, each touch unit 15 covers a plurality of sub-pixels 11, each touch unit 15 is connected to the touch recognition module through at least one touch line, and different touch units 15 are connected to the touch recognition module through different touch lines.

In the example, the display substrate may have a resolution of 720*1560 (columns*rows). The touch unit 15 in the display substrate may adopt a structure of 18H*32V. The 18H*32V means that in a third direction (i.e., a row direction), the touch unit 15 covers 18 columns of sub-pixels 11, and in a fourth direction (i.e., a column direction), the touch unit 15 covers 32 rows of sub-pixels 11. However, the resolution of the display substrate is 720*1560, and 1560 is not divisible by 32. In order to solve this problem, in the example, the touch unit 15 may be set as follows.

For two adjacent rows of touch units 15, one of the two adjacent rows of touch units 15 cover 48 rows of sub-pixels 11, and the other one of the two adjacent rows of touch units 15 cover 49 rows of sub-pixels 11.

Figure 2A:
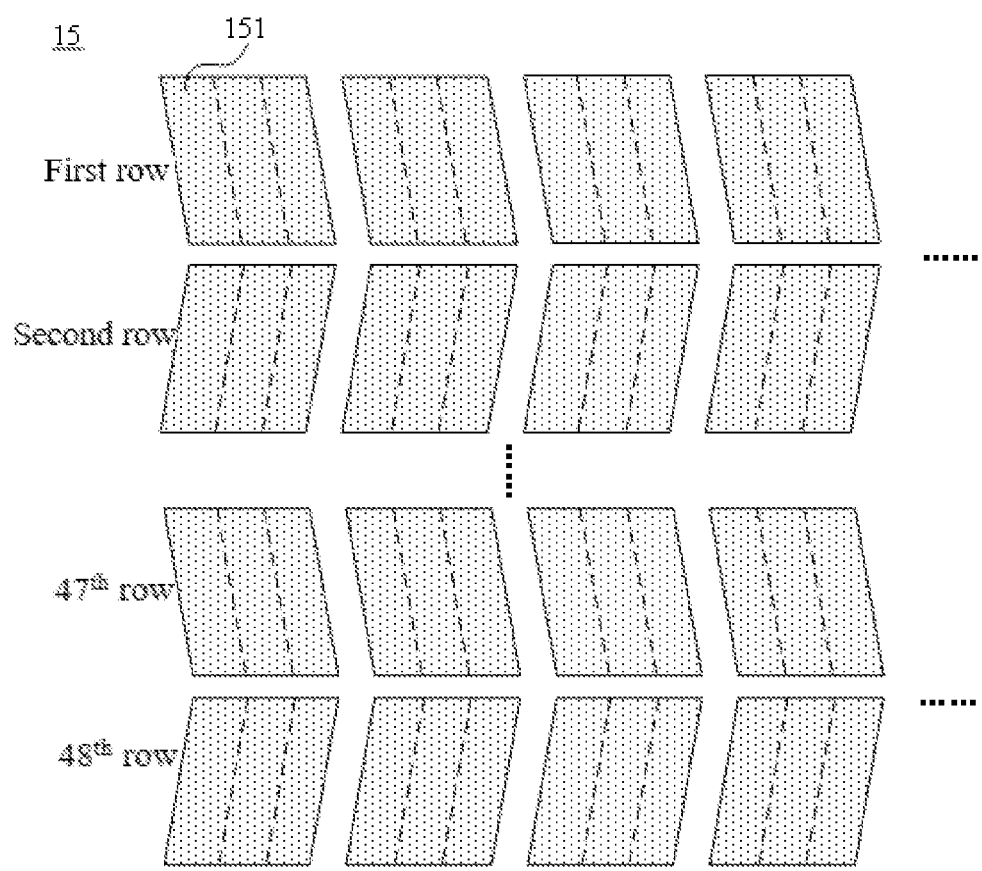
FIG. 2a and FIG. 2b schematically show schematic diagrams of two adjacent rows of touch blocks in an example.
Figure 2B:
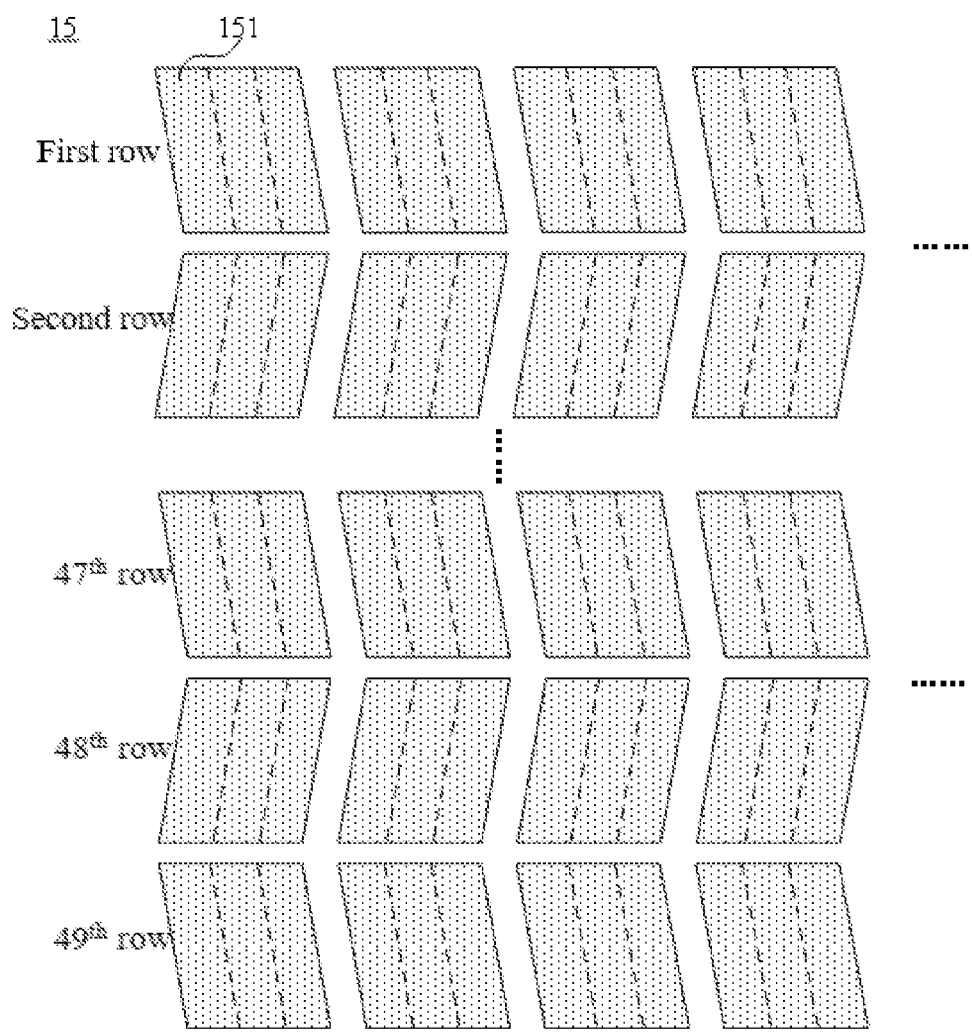

FIG. 2a and FIG. 2b schematically show schematic diagrams of two adjacent rows of touch units in an example, wherein FIG. 2a shows a former row of the two adjacent rows of the touch units 15, and FIG. 2b shows a latter row of the two adjacent rows of the touch units 15. The touch units in FIG. 2a cover 48 rows of sub-pixels 11, and the touch units in FIG. 2b cover 49 rows of sub-pixels 11. As shown in FIG. 2a and FIG. 2b, the touch unit 15 includes a plurality of touch blocks 151, at least one touch block 151 corresponds to at least one sub-pixel 11, and different touch blocks 151 correspond to different sub-pixels 11. For example, the touch blocks 151 and the sub-pixels 11 are arranged in a one-to-one correspondence. Since the display substrate adopts the design of 2Pixel2Domain, the touch block 151 is generally arranged in an inclined manner and an inclined direction of the touch block 151 is the same as an inclined direction of the pixel electrode 12 of the sub-pixel 11 corresponding to the touch block 151, in order to match the touch block 151 with the sub-pixel 11.

The inventor found in the research that in the fourth direction, the plurality of touch blocks 151 of the touch unit 15 covering 48 rows of sub-pixels 11 are periodic repeating patterns, while the plurality of touch blocks 151 of the touch unit 15 covering 49 rows of sub-pixels 11 are not periodic repeating patterns, which resulting in a large difference between the touch units 15 covering 48 rows of sub-pixels 11 and the touch units 15 covering 49 rows of sub-pixels 11. Specifically, as shown in FIG. 2a, the first row of the touch blocks 151 of the touch units 15 covering 48 rows of sub-pixels are inclined to the right, and the last row of the touch blocks 151 are inclined to the left. As shown in FIG. 4b, the first row of the touch blocks 151 of the touch units 15 covering 49 rows of sub-pixels are inclined to the right, and the last row of the touch blocks 151 are also inclined to the right. A pattern difference of two adjacent rows of touch units 15 is obvious. Therefore, a reflective light effect of one of two adjacent rows of touch units 15 is different from a reflective light effect of the other one of two adjacent rows of touch units 15, such that a visible horizontal stripe will be formed between the two adjacent rows of touch units 15, that is, a bad horizontal stripe will be formed.

Figure 3A:
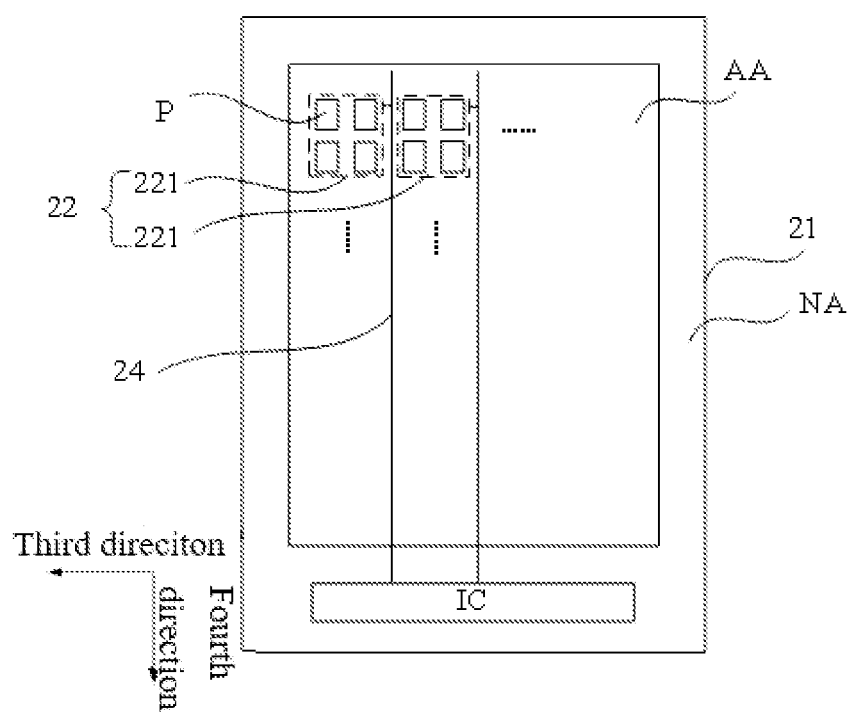
FIG. 3a schematically shows a first schematic diagram of the display substrate in the embodiment of the present disclosure.
Figure 3B:
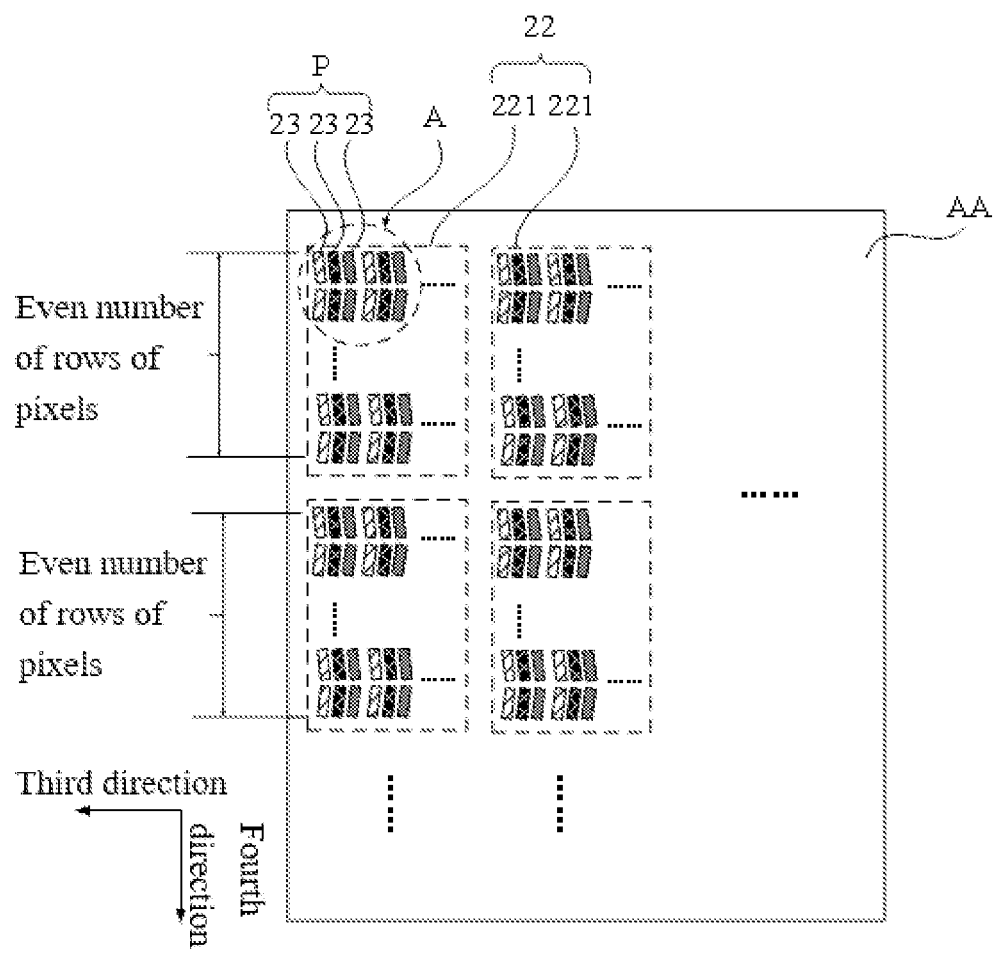
FIG. 3b schematically shows a second schematic diagram of the display substrate in the embodiment of the present disclosure.
Figure 3C:
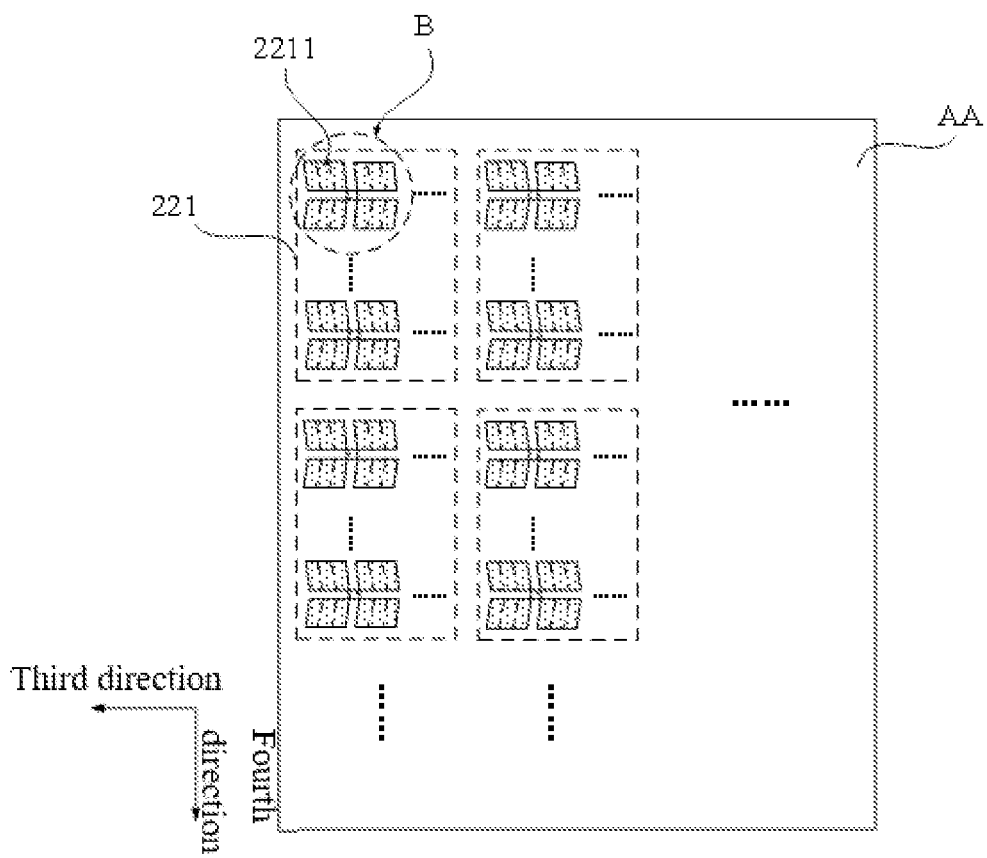
FIG. 3c schematically shows a third schematic diagram of the display substrate in the embodiment of the present disclosure.
Figure 4:
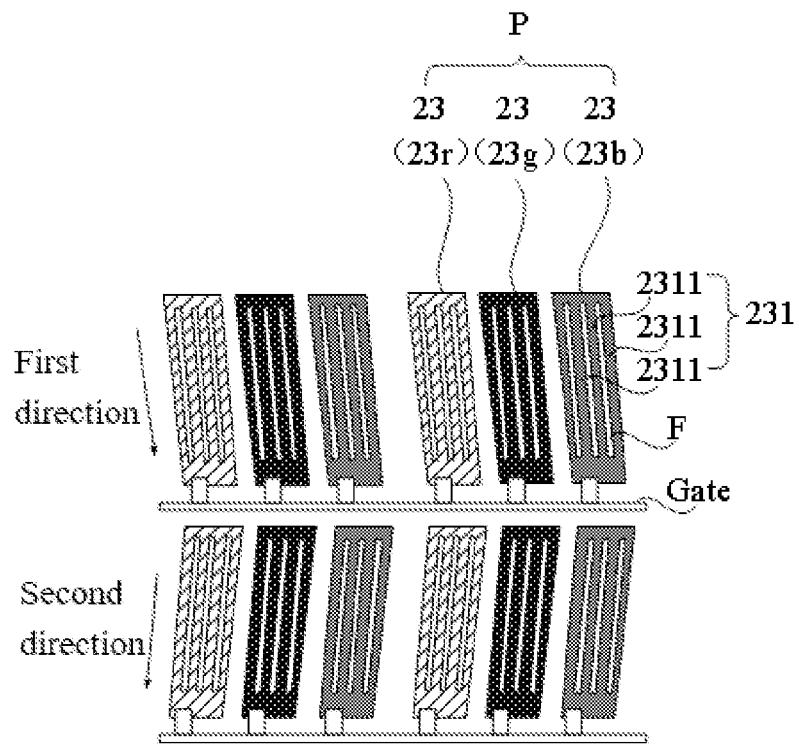
FIG. 4 schematically shows a first schematic diagram at position A in FIG. 3b.

In the view of this, an embodiment of the present disclosure provides a display substrate. FIG. 3a schematically shows a first schematic diagram of the display substrate in the embodiment of the present disclosure, FIG. 3b schematically shows a second schematic diagram of the display substrate in the embodiment of the present disclosure, and FIG. 3c schematically shows a third schematic diagram of the display substrate in the embodiment of the present disclosure. As shown in FIGS. 3a to 3c, in the embodiment of the present disclosure, the display substrate may be divided into a display region AA and a non-display region NA outside the display region AA. The display substrate includes: a base substrate 21, a touch electrode 22, a plurality of pixel units P and a plurality of touch lines 24. Each pixel unit P includes a plurality of sub-pixels 23 arranged in the display region AA. The plurality of sub-pixels 23 may be arranged in an array along a third direction (i.e., a row direction) and a fourth direction (i.e., a column direction). The plurality of sub-pixels 23 may display multiple colors, and different sub-pixels 23 may display different colors. For example, each pixel unit P includes a red sub-pixel, a green sub-pixel, and a blue sub-pixel. FIG. 4 schematically shows a first schematic diagram at position A in FIG. 3b. For the sake of clarity, only the sub-pixels 23 and the gate lines are shown in FIG. 4. As shown in FIG. 4, at least some of the sub-pixels 23 include(s) a first electrode 231. For two adjacent rows of sub-pixels 23, the first electrodes 231 of sub-pixels 23 in one of the two adjacent rows extend in a first direction, and the first electrodes 231 of sub-pixels 23 in the other one of the two adjacent rows extend in a second direction intersecting with the first direction.

For example, each sub-pixel 23 includes a first electrode 231. Optionally, a second electrode matched with the first electrode 231 of each sub-pixel 23 is further provided on the display substrate. For example, the second electrode may be provided on a side of the first electrode 231 away from the base substrate 21.

Optionally, the display substrate may be a liquid crystal display substrate. Each sub-pixel 23 further includes a liquid crystal layer (not shown in the drawings). The first electrode 231 and the second electrode may generate a corresponding liquid crystal electric field under a driving of a driving signal. A liquid crystal in the liquid crystal layer may be deflected under an action of the liquid crystal electric field, thereby realizing a corresponding display function. Exemplarily, a liquid crystal layer may be disposed between the first electrode 231 and the second electrode. One of the first electrode 231 and the second electrode may be a pixel electrode, the other one of the first electrode 231 and the second electrode may be a common electrode, for example, the first electrode 231 is a pixel electrode, and the second electrode is a common electrode.

Optionally, the plurality of sub-pixels 23 are divided into a plurality of groups, at least one group includes two adjacent rows of sub-pixels 23, and different groups of sub-pixels 23 belong to different rows. In other words, in the embodiment of the present disclosure, the plurality of rows of sub-pixels 23 are repeatedly arranged on the display substrate in a period of two rows. For any one group of sub-pixels 23, the first electrodes 231 of the sub-pixels 23 in one row extend in the first direction, and the first electrodes 231 of the sub-pixels 23 in the other one row extend in the second direction. That is, in the embodiment of the present disclosure, the display substrate adopts the sub-pixels structure of 2Pixel2Domain mentioned above.

In the embodiment of the present disclosure, the touch electrode 22 may be multiplexed as the second electrode of the sub-pixel, which will be described in detail below, and it is not repeated here. As shown in FIG. 3*a*, the touch electrode 22 includes a plurality of touch units 221, at least one touch unit 221 is connected to at least one touch line 24, and different touch units 221 are connected to different touch lines 24. For example, each touch unit 221 is connected to one touch line 24, or each touch unit 221 is connected to a plurality of touch lines 24, which may be set as desired in practice and is not limited herein. Each touch unit 221 may be connected to the touch recognition module through the touch line 24. For example, each touch unit 221 is connected to a pin of the touch recognition module through the touch line 24.

In the embodiment of the present disclosure, the non-display region NA of the display substrate includes a signal input side (on a lower side of the display region AA in FIG. 3). On the signal input side, a driver chip IC may be provided. The touch recognition module may be integrated in the driver chip IC. For example, the driver chip IC may be a TDDI chip. The plurality of touch lines 24 may extend to the lower side of the display region AA along the fourth direction, so as to be connected to the touch recognition module. In a display stage, the TDDI chip may provide driving signal(s) for displaying to the touch unit 221 through the touch line 24. At this time, the touch unit 221 is multiplexed as the second electrode, and a corresponding electric field may be formed between the first electrode 231 and the second electrode, so as to realize a display function. In a touch stage, the TDDI chip may provide touch signal(s) for touch recognition so as to realize a touch function.

As shown in FIG. 3*c*, the touch unit 221 may include a plurality of touch blocks 2211. As shown in FIG. 3*b*, FIG. 3*c* and FIG. 4, at least one touch block 2211 of the touch unit 221 corresponds to at least one sub-pixel 23. Different touch blocks 2211 correspond to different sub-pixels 23. For example, the touch blocks 2211 and the sub-pixels 23 are arranged in a one-to-one correspondence. Optionally, the touch block 2211 has a strip shape, the touch block 2211 may be inclined, and a direction along which the touch block 2211 extends is substantially the same as a direction along which the first electrode 231 of the sub-pixel corresponding to the touch block 2211 extends.

In the embodiment of the present disclosure, each touch unit 221 covers an even number of rows of sub-pixels 23. Therefore, for the plurality of rows of sub-pixels 23 covered by each touch unit 221, if the first electrodes 231 of the first row of sub-pixels 23 extend in the first direction, then the first electrodes 231 of the last row of sub-pixels 23 extend in the second direction. Therefore, for any touch unit 221, if the first row of touch blocks 2211 in the touch unit 221 extend in the first direction, the last row of touch blocks 2211 extend in the second direction. In other words, in the fourth direction, the plurality of touch blocks 2211 in each touch unit 221 are the periodic repeating patterns, so the difference in overall pattern between two adjacent rows of touch units 221 will not produce obviously, so as to avoid the horizontal stripe caused by a large difference between the patterns of two adjacent rows of touch units 221, thereby improving the display effect.

It should be noted that in the embodiment of the present disclosure, a liquid crystal display substrate is taken as an example to describe the display substrate of the embodiment of the present disclosure. It should be understood that the display substrate of the embodiment of the present disclosure may be a substrate of other types, such as OLED display substrate, etc., which may be set as desired in practice and is not limited here.

It should also be noted that in FIGS. 3*a* to 3*c*, the sub-pixels 23 and the touch blocks 2211, etc. are schematically shown in a rectangular shape, but this does not limit the shapes of the sub-pixels 23 and the touch blocks 2211 provided by the embodiments of the present disclosure.

The structure of the display substrate according to the embodiment of the present disclosure will be further described below.

As shown in FIG. 4, in some embodiments, the first electrodes 231 of at least one sub-pixel 23 includes a plurality of strip electrodes 2311, and the plurality of strip electrodes 2311 of the same sub-pixel are separated by a plurality of slits F. The plurality of strip electrodes 2311 of the same sub-pixel 23 extend in an approximate same direction. In other words, the plurality of strip electrodes 2311 all extend substantially along the first direction or the second direction.

Figure 5:
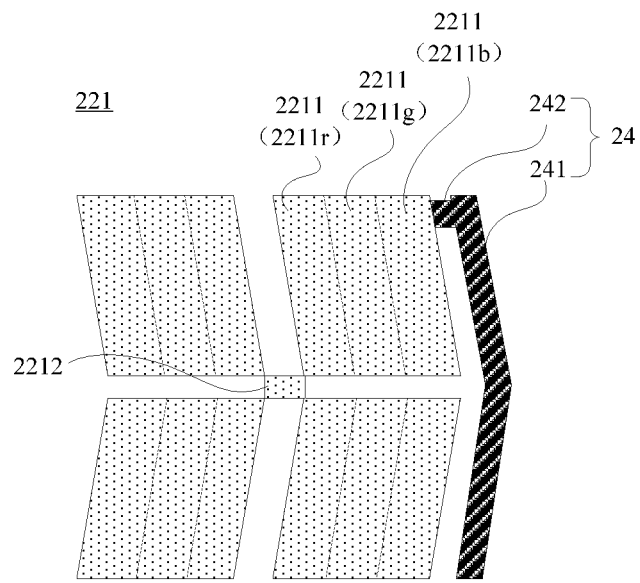
FIG. 5 schematically shows a second schematic diagram at position A in FIG. 3b.

FIG. 5 schematically shows a second schematic diagram at position A in FIG. 3*b*. For the sake of clarity, only the touch unit and the touch line are shown in FIG. 5. As shown in FIG. 5, in some embodiments, at least one touch unit 221 includes a plurality of touch blocks 2211. As shown in FIG. 4 and FIG. 5, at least one touch block 2211 correspond to at least one sub-pixel 23, and different touch blocks 2211 correspond to different sub-pixels 23.

For example, each touch unit 221 covers multiple rows and multiple columns of sub-pixels 23. Each touch unit 221 may include a plurality of touch blocks 2211, and the touch blocks 2211 and the sub-pixels 23 are arranged in a one-to-one correspondence. The touch block 2211 is multiplexed as the second electrode of the sub-pixel 23 corresponding to the touch block 2211, and the second electrode and the first electrode 231 form a driving electrode of the sub-pixel 23. For example, the first electrode 231 may be a pixel electrode, and the second electrode may be a common electrode. The touch block 2211 is in form of a flat plate, for example, an orthographic projection of the touch block 2211 on the base substrate 21 is approximately rectangle or the like.

In some embodiments, a preset angle is formed between the first direction and the second direction, such that: for two adjacent rows of sub-pixels, a first domain electric field may be formed by the driving electrodes of sub-pixels 23 in one row of the two adjacent rows, a second domain electric field may be formed by the driving electrodes of the sub-pixels 23 in the other one row of the two adjacent rows, and a direction of the first domain electric field is different form a direction of the second domain electric field. In the embodiment of the present disclosure, the preset angle may be set as desired in practice and is not limited herein.

In some embodiments, the plurality of sub-pixels 23 form a plurality of pixel units P, with at least one pixel unit P including more than one sub-pixels 23 in different colors. For example, one pixel unit may include the sub-pixels 23 in three colors, for example, a red sub-pixel, a blue sub-pixel, and a green sub-pixel. For another example, one pixel unit may include the sub-pixels in four colors, for example, a red sub-pixel, a blue sub-pixel, a green sub-pixel, a white sub-pixel, etc.

In some embodiments, a plurality of touch blocks 2211 in the same touch unit 221 are divided into a plurality of groups, with at least one group including more than one touch blocks 2211. The plurality of sub-pixels 23 corresponding to the plurality of touch blocks 2211 in at least one group belong to the same pixel unit P, and the plurality of sub-pixels 23 corresponding to the plurality of touch blocks 2211 in different groups belong to different pixel units P. The plurality of touch blocks 2211 in the same group are connected to each other.

For example, a group of touch blocks include three touch blocks 2211 (e.g., a first touch block 2211b, a second touch block 2211g, and a third touch block 2211r), and the group of touch blocks cover a pixel unit P. The pixel unit P covered by the group of touch blocks includes three sub-pixels 23 (e.g., a first sub-pixel 23b, a second sub-pixel 23g, and a third sub-pixel 23r). The three touch blocks 2211 in the group of touch blocks may be arranged in a one-to-one correspondence with the three sub-pixels 23 in the pixel unit P covered by the group of touch blocks. The three touch blocks 2211 are formed as an integral structure, for example, an orthographic projection of the integral structure formed by the three touch blocks 2211 on the base substrate 21 is approximately rectangle or the like.

In some embodiments, the touch blocks in different groups are spaced from each other by an interval, and the touch blocks 2211 belonging to different groups in the same touch unit 221 are connected to each other through a first connection part 2212.

In the embodiment of the present disclosure, the interval (s) by which different groups of touch blocks 2211 are spaced from each other may be implemented by a first hollow structure and a third hollow structure, which will be mentioned below. Through spacing different groups of touch blocks 2211 from each other, a part of a signal line may be exposed, such that a parasitic capacitance formed between the touch block 2211 and the signal line is reduced, thereby reducing an influence of the parasitic capacitance to the displaying. Specifically, it will be introduced in detail below, and it is not repeated here.

In the embodiment of the present disclosure, the touch blocks 2211 in different groups in the same touch unit 221 are connected to each other through the first connection part 2212, so that all of the touch blocks 2211 in the same touch unit 221 are connected together, thereby allowing these touch blocks 2211 to be connected to the touch recognition module through one or more touch lines 24.

In some embodiments, the plurality of groups of touch blocks connected to the first connection part 2212 surround the first connection part 2212.

For example, as shown in FIG. 5, the plurality of groups of touch blocks 2211 connected to the first connection part 2212 may include four groups of touch blocks, that is the four groups of touch blocks respectively located at an upper left, a lower left, an upper right, and a lower right of the first connection part 2212.

In some embodiments, the plurality of sub-pixels 23 include a plurality of first sub-pixels 23b capable of displaying a first color, and the plurality of touch blocks 2211 in at least one touch unit 221 include a plurality of first touch blocks 2211b. At least one first touch block 2211b corresponds to at least one first sub-pixel 23b, and different first touch blocks 2211b correspond to different first sub-pixels 23b. At least one touch line 24 includes a body part 241 and a plurality of protrusions 242 on a side of the body part 241. The plurality of protrusions 242 are arranged along a length direction of the touch line 24, at least one of the protrusions 242 corresponds to at least one of the first touch blocks 2211b, and different protrusions 242 correspond to different first touch blocks 2211b. An orthographic projection of at least one protrusion 242 on the base substrate 21 at least partially overlaps with an orthographic projection of the first touch block 2211b corresponding to the protrusion 242 on the base substrate 21. It should be noted that, in the embodiment of the present disclosure, the protrusions 242 and the first touch blocks 2211b are disposed in different layers, and the protrusions 242 is disposed on a side of the first touch blocks 2211b close to the base substrate 21. Therefore, in FIG. 5, the part of the protrusions 242 overlapping with the first touch blocks 2211b is shield by the first touch blocks 2211b. In this way, the protrusion 242 may be connected to the corresponding first touch block 2211b through the via hole, so as to realize a connection between the touch electrode 22 and the touch line 24.

For example, each touch line 24 includes a body part 241 and a plurality of protrusions 242 on a side of the body part 241, and the protrusion 242 is located on the left side of the body part 241. Of course, in other embodiments, the protrusion 242 may be located on the right side of the body part 241. The side of the body part 241 on which the protrusion 242 is specifically disposed may be set as desired and is not limited here.

For example, the first touch blocks 2211b and the first sub-pixels 23b are arranged in a one-to-one correspondence. An orthographic projection of each protrusion 242 on the base substrate 21 partially overlaps with an orthographic projection of the first touch block 2211b corresponding to the protrusion on the base substrate 21.

In some embodiments, the touch line 24 is located on a side of the touch unit 221 close to the base substrate 21. The first touch blocks 2211b in at least one touch unit 221 are arranged in an array, and at least some of the first touch blocks 2211b in at least one column in the touch unit 221 is/are connected to the protrusion 242 corresponding to the first touch block(s) 2211b through the via hole(s). For example, some of the first touch blocks 2211b in one column in the touch unit 221 is/are connected to the protrusion(s) 242 corresponding to the first touch block(s) 2211b through the via hole(s). Alternatively, some of the first touch blocks 2211b in each of the columns in the touch unit 221 is/are connected to the protrusion(s) 242 corresponding to the first touch block(s) 2211b through the via hole(s), which may be set as desired and is not limited here.

In some embodiments, the first touch block(s) 2211b in one of two adjacent rows is/are connected to the protrusion (s) 242 corresponding to the first touch block(s) 2211b through the via hole(s). For example, the first touch block 2211b in the odd numbered row is connected to the protrusion 242 corresponding to the first touch block 2211b through the via hole, and the first touch block 2211b in the even numbered row is spaced apart from the protrusion 242 corresponding to the first touch block 2211b. Of course, it is also possible that the first touch block 2211b in the even numbered row is connected to the protrusion 242 corresponding to the first touch block 2211b through the via hole, and the first touch block 2211b in the odd numbered row is spaced apart from the protrusion 242 corresponding to the first touch block, which may be set as desired and is not limited here.

Figure 6:
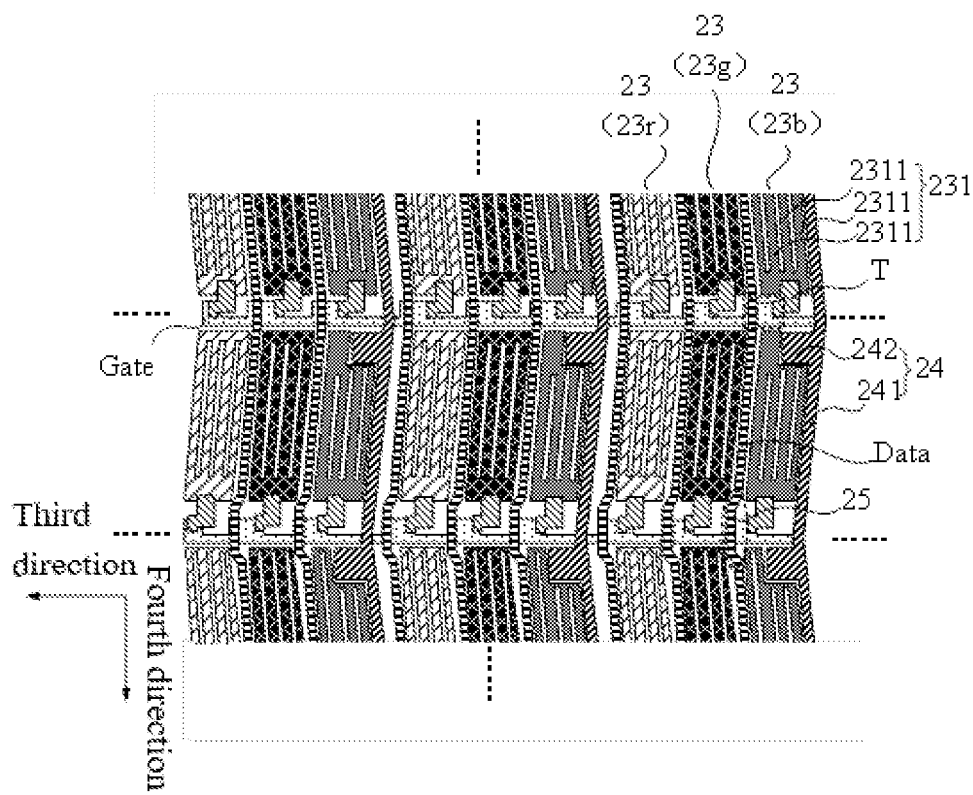
FIG. 6 schematically shows a schematic diagram of first electrodes and signal lines in the embodiment of the present disclosure.
Figure 7:
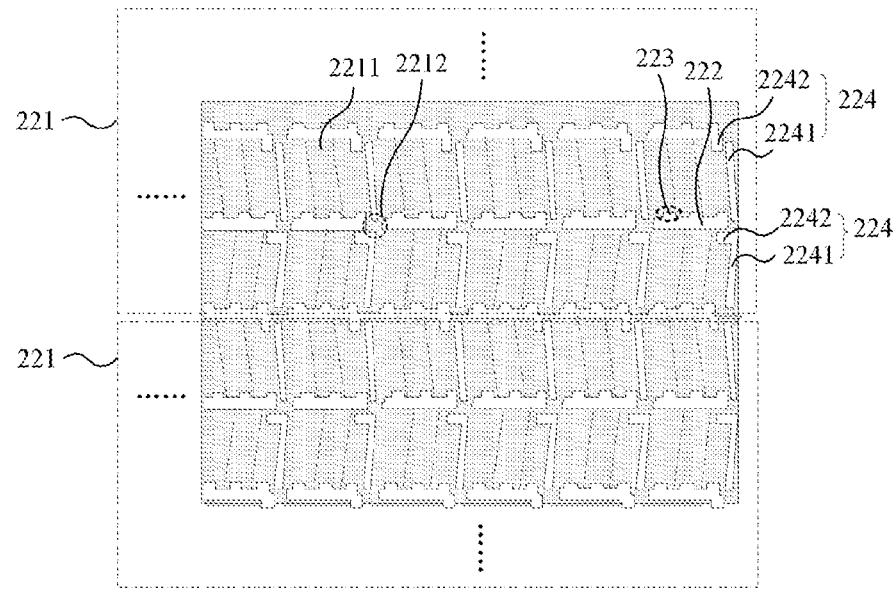
FIG. 7 schematically shows a schematic diagram of hollow structures of the touch electrode in the embodiment of the present disclosure.

FIG. 6 schematically shows a schematic diagram of the first electrodes and the signal lines in the embodiment of the present disclosure. As shown in FIG. 6, in some embodiments, the display substrate further includes a plurality of gate lines Gate extending in a row direction. One row of sub-pixels 23 are connected to the same gate line Gate. FIG. 7 schematically shows a schematic diagram of hollow structures of the touch electrode in the embodiment of the present disclosure. With reference to FIG. 6 and FIG. 7, the touch electrode 22 further includes a plurality of rows of first hollow structures 222. At least one row of the first hollow structures 222 corresponds to at least one of the gate lines Gate, and different rows of first hollow structures 222 correspond to different gate lines Gate. An orthographic projection of at least one row of first hollow structures 222 on the base substrate 21 at least partially overlaps with an orthographic projection of the gate line Gate corresponding to the at least one row of first hollow structures 222 on the base substrate 21.

In the embodiment of the present disclosure, the first hollow structures and the gate lines Gate may be arranged in a one-to-one correspondence. Each first hollow structure 222 may expose a part of the gate line Gate corresponding to the first hollow structure 222, thereby reducing the parasitic capacitance formed between the touch electrode 22 and the gate line Gate. A shape of the first hollow structure 222 may be set as desired in practice, for example, the first hollow structure 222 may be a strip hollow structure.

As shown in FIG. 6, in some embodiments, the first electrode 231 of at least one sub-pixel includes a plurality of strip electrodes 2311. A length of at least one strip electrode 2311 of at least one first sub-pixel 23b is smaller than a length of a plurality of strip electrodes 2311 of other sub-pixels 23, so that an overlapped area between the first electrode 231 of the first sub-pixel 23b and the touch line 24 may be reduced, and the parasitic capacitance between the first electrode 231 of the first sub-pixel 23b and the touch line 24 may be reduced.

In some embodiments, the first sub-pixel 23b is a blue sub-pixel 23. Since a luminous efficiency of the blue sub-pixel 23 is low, a size of the strip electrode 2311 has little effect on the luminous brightness of the blue sub-pixel 23. Therefore, even if the size of the strip electrode 2311 is reduced, the blue sub-pixel 23 may still maintain a good light emitting effect. Of course, the plurality of sub-pixels 23 further include a second sub-pixel 23g and a third sub-pixel 23r. The color of the second sub-pixel 23g may be green, and the color of the third sub-pixel 23r may be red.

Figure 8:
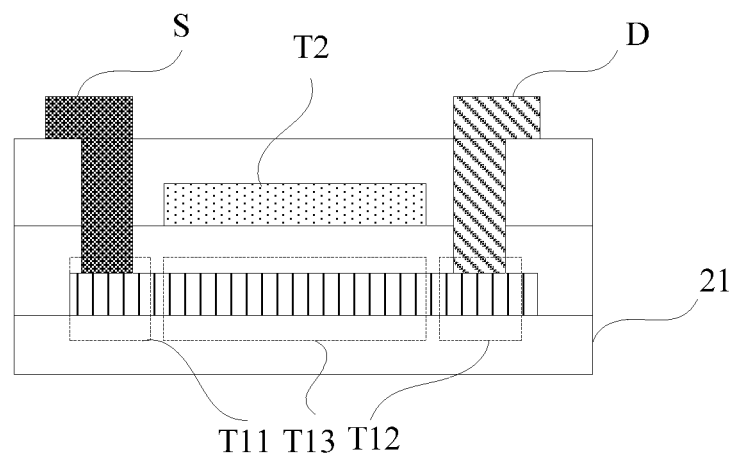
FIG. 8 schematically shows a cross-sectional view of a thin film transistor in the embodiment of the present disclosure.

In some embodiments, the display substrate further includes a plurality of data lines Data extending in column direction, and at least one sub-pixel 23 further includes a thin film transistor T connected to the data line Data. In the embodiment of the present disclosure, the thin film transistor T may be a top-gate structure or a bottom-gate structure, which may be determined according to actual needs, and it is not limited herein. The thin film transistor T in the embodiment of the present disclosure will be described below by taking the thin film transistor T having the bottom-gate structure as an example. FIG. 8 schematically shows a cross-sectional view of a thin film transistor in an embodiment of the present disclosure. As shown in FIG. 8, in some embodiments, the thin film transistor T includes a semiconductor layer T1 on the base substrate 21 and a gate layer T2 on a side of the semiconductor layer T1 away from the base substrate 21. The gate layer T2 and the gate line Gate may be formed as an integral structure. The semiconductor layer T1 includes a first electrode connection part T11, a second electrode connection part T12 and a channel part T13 between the first electrode connection part T11 and the second electrode connection part T12. One of the first electrode connection part T11 and the second electrode connection part T12 is connected to a source S of the thin film transistor T, and the other one is connected to a drain D of the thin film transistor T. The channel part T13 is disposed directly opposite to the gate layer T2, and the channel part T13 is in form of a straight line. For example, the channel part T13 of the thin film transistor T may extend along the third direction shown in FIG. 6.

As shown in FIG. 6 and FIG. 7, the touch electrode 22 further includes a plurality of second hollow structures 223. At least one second hollow structure 223 corresponds to at least one sub-pixel 23, and different second hollow structures 223 correspond to different sub-pixels 23. In addition, an orthographic projection of the at least one second hollow structure 223 on the base substrate 21 at least partially overlaps with an orthographic projection of the thin film transistor T of the sub-pixel 23 corresponding to the second hollow structure 223 on the base substrate 21. In other words, the second hollow structure 223 may expose at least a part of the thin film transistor T of the sub-pixel 23 corresponding to the second hollow structure 223, so that a parasitic capacitance formed between the touch electrode 22 and the thin film transistor T may be reduced.

For example, the second hollow structures 223 and the sub-pixels 23 may be arranged in a one-to-one correspondence, and an orthographic projection of each second hollow structure 223 on the base substrate 21 at least partially overlaps with an orthographic projections of the thin film transistor T of the sub-pixel 23 corresponding to the second hollow structure 223, so as to minimize the parasitic capacitance formed between the touch electrode 22 and the thin film transistor T as much as possible.

In some embodiments, one column of sub-pixels 23 are connected to the same data line Data. The sub-pixel 23 includes a first side and a second side opposite to the first side, that is, the left side and the right side of each sub-pixel in FIG. 6. An orthographic projection of at least one data line Data on the base substrate 21 is on the first side of an orthographic projection of the sub-pixels 23 connected to the data line Data on the base substrate 21. At least one data line Data is divided into a plurality of segments, and at least one segment comprises a first part corresponding to an odd numbered row of sub-pixel 23 and a second part corresponding to an even numbered row of sub-pixels 23. A direction along which the first part extends is substantially the same as a direction along which the first electrodes 231 of the sub-pixels 23 corresponding to the first part extend, and a direction along which the second part extends is substantially the same as a direction along which the first electrodes 231 of the sub-pixels 23 corresponding to the second part extend. Two adjacent segments of at least one data line Data are connected to each other by a second connection part 25. The second connection part 25 is bended in a third direction directing from the second side of the sub-pixel 23 to the first side of the sub-pixel 23.

In the embodiment of the present disclosure, the second connection part 25 may be bended to the left or the right, which may be set as desired and is not limited herein. With the second connection part 25, on one hand, the data line Data may be better bended, so that the direction along which the data line Data extends is substantially the same as the direction along which the first electrode 231 of the sub-pixel 23 connected to the data line Data extends; on the other hand, bending the second connection part 25 in the third direction facilitates to achieve a sufficient distance between a first electrode and a second electrode of the thin film transistor T, thereby allowing the size of the channel part of the thin film transistor T in the sub-pixel 23 to meet the corresponding design requirements.

In some embodiments, the touch electrode 22 further includes a plurality of columns of third hollow structures 224. At least one column of third hollow structures 224 corresponds to at least one touch line 24, and different columns of third hollow structures 224 correspond to different touch lines 24. At least one column of third hollow structures 224 includes: a plurality of second hollow parts 2241 spaced from each other and arranged in a direction along which the third hollow structure 224 extends and a third hollow part 2242 disposed on a side of at least one second hollow part 2241. At least one third hollow part 2242 corresponds to at least one protrusion 242 of the touch line 24 corresponding to the at least one third hollow part 2242, and different third hollow parts 2242 correspond to different protrusions 242; an orthographic projection of at least one third hollow part 2242 on the base substrate 21 at least partially overlaps with an orthographic projection of the protrusion 242 corresponding to the at least one third hollow part 2242 on the base substrate; and an orthographic projection of at least one second hollow part 2241 on the base substrate 21 at least partially overlaps with an orthographic projection of the body part 241 of the touch line 24 corresponding to the at least one second hollow part 2241 on the base substrate. In other words, the third hollow structure 224 may make expose the touch line 24, so as to reduce the parasitic capacitance formed between the touch unit 221 and the touch line 24.

For example, each column of third hollow structures 224 includes a plurality of second hollow parts 2241 and a plurality of third hollow parts 2242. The plurality of second hollow parts 2241 are spaced apart from each other. The orthographic projection of the second hollow part 2242 on the base substrate 21 at least partially overlaps with the orthographic projection of the body part 241 of the corresponding touch line 24 on the base substrate 21. In other words, the second hollow structure 2241 may expose at least a part of the body part 241 of the corresponding touch line 24, so as to reduce the parasitic capacitance formed between the touch electrode 22 and the touch line 24. The orthographic projection of each third hollow part 2242 on the base substrate 21 partially overlaps with the orthographic projection of the corresponding protrusion on the base substrate 21, thereby greatly reducing the parasitic capacitance formed between the touch unit 221 and the touch line 24.

In some embodiments, for at least one column of third hollow structures 224, a $j^{th}$ third hollow part 2242 is connected to the first hollow structure 222, and the $j^{th}$ third hollow part 2242 is spaced apart from the second hollow part 2241. A $(j+1)^{th}$ third hollow part 2242 is spaced apart from the first hollow structure 222, and the $(j+1)^{th}$ third hollow part 2242 is connected to the second hollow part 2241, wherein j is a positive integer. In this way, for the $j^{th}$ third hollow part 2242, since the third hollow part 2242 is connected to the first hollow structure 222, a width of the region of connection between the second connection part 25 and the touch block 2211 is easy to be set larger, which is beneficial to reduce the resistance of the touch unit 221. For the $(j+1)^{th}$ third hollow part 2242, since the third hollow part 2242 is connected to the second hollow part 2241, it is facilitative to provide the via hole, so that the protrusion 242 of the touch line 24 may be connected with the corresponding touch block 2211 through the via hole.

The specific manner in which the touch unit 221 covers the sub-pixels 23 in the embodiment of the present disclosure will be described below.

In some embodiments, the plurality of touch units 221 are arranged in an array, and touch units 221 in the same row cover the same number of rows of sub-pixels 23.

In some embodiments, the number of rows of sub-pixels covered by each row of touch units is the same as the number of rows of sub-pixels covered by another row of touch units.

Figure 9A:
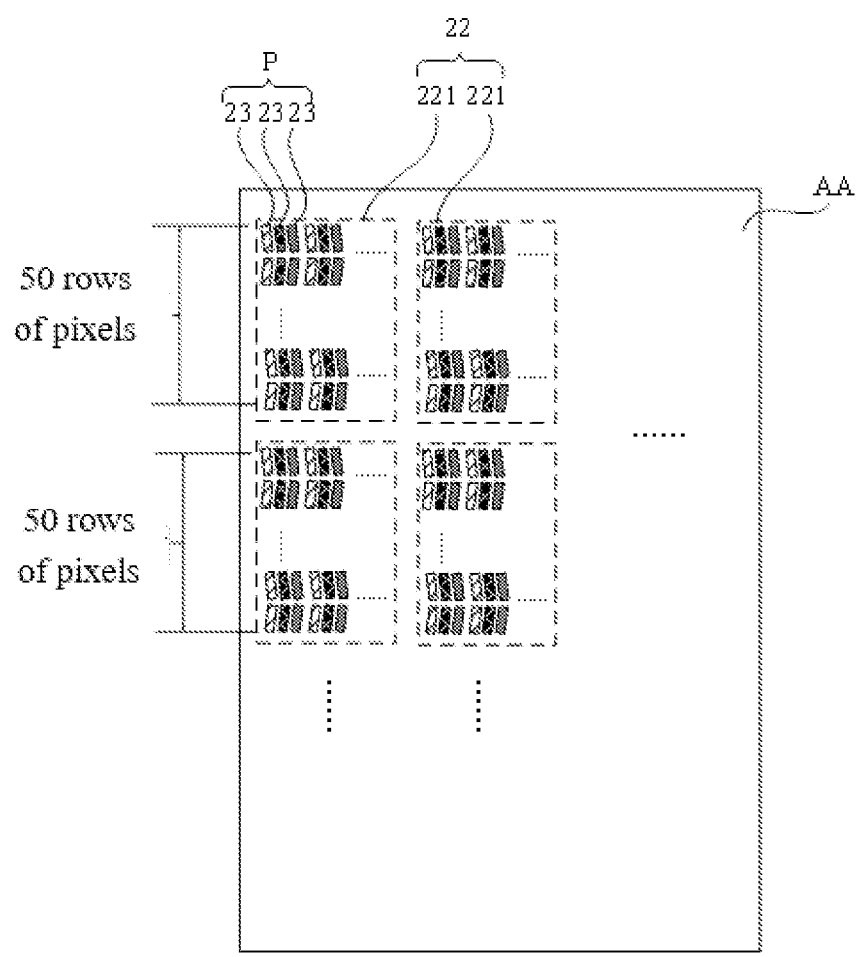
FIG. 9a schematically shows a fourth schematic diagram of the display substrate according to the embodiment of the present disclosure.

For example, FIG. 9a schematically shows a fourth schematic diagram of a display substrate according to an embodiment of the present disclosure. As shown in FIG. 9a, the display substrate has a resolution of 720*1600. 32 rows of touch units 221 may be arranged in the display substrate, wherein each touch unit 221 may cover 50 rows of sub-pixels 23. Optionally, 18 columns of touch units 221 may be provided in the display substrate, wherein each touch unit 221 may cover 40 rows of sub-pixels 23.

In some embodiments, the number of rows of sub-pixels 23 covered by each of at least two rows of the touch units 221 is different from the number of rows of sub-pixels 23 covered by another one of at least two rows of the touch units 221. For example, the number of rows of sub-pixels 23 covered by one of two adjacent rows of touch units 221 is different from the number of rows of sub-pixels covered by the other one of two adjacent rows of touch units. Alternatively, a plurality of rows of touch units 221 may be divided into a plurality of groups, each of the plurality of groups including the plurality of adjacent rows of touch units, and the number of rows of sub-pixels 23 covered by the touch units 221 in one group is different from the number of rows of sub-pixels covered by the touch units in the other one group.

In some embodiments, the number of rows of sub-pixels 23 covered by at least one row of first to $n^{th}$ rows of touch units 221 is different from the number of rows of sub-pixels 23 covered by at least one row of $(n+1)^{th}$ to $m^{th}$ rows of touch units 221; and/or, the number of rows of sub-pixels 23 covered by at least one row of $(n+1)^{th}$ to $m^{th}$ rows of touch units 221 is different from the number of rows of sub-pixels 23 covered by at least one row of $(m+1)^{th}$ to a $N^{th}$ rows of touch units 221, wherein N is a total number of the rows of touch units 221, each of m and n is an integer, and $1 \leq n < m < N$.

In the embodiment of the present disclosure, the touch units 221 are arranged in the above-mentioned manner, such that the touch units 221 in the middle part of the display substrate may be arranged in a most efficient layout, while the touch units 221 in the top or bottom part of the display substrate may be arranged in a more flexible manner, so as to satisfy various requirements of the display substrate, such as special-shaped display.

In some embodiments, a relationship between n and m satisifies:

$$21\% \geq \frac{n}{m} \geq 2\%;$$

and/or, the relationship between n and N satisifies:

$$16\% \geq \frac{n}{N} \geq 3\%;$$

and/or, the relationship between m and N satisifies:

$$97\% \geq \frac{m}{N} \geq 75\%.$$

For example, N=32, n may be any one from 1 to 5, m may be any one from 25 to 31.

In some embodiments, the plurality of touch units 221 satisfy the following relationship:

y<x, and y<z; or, y>x and y<z; or y>x and y>z.

wherein, x is the number of rows of sub-pixels 23 covered by the at least one row of the first to $n^{th}$ rows of touch units 221, y is the number of rows of sub-pixels 23 covered by the at least one row of the $(n+1)^{th}$ to $m^{th}$ rows of touch units 221, z is the number of rows of sub-pixels 23 covered by the at least one row of the $(m+1)^{th}$ to $N^{th}$ rows of touch units 221.

Figure 9B:
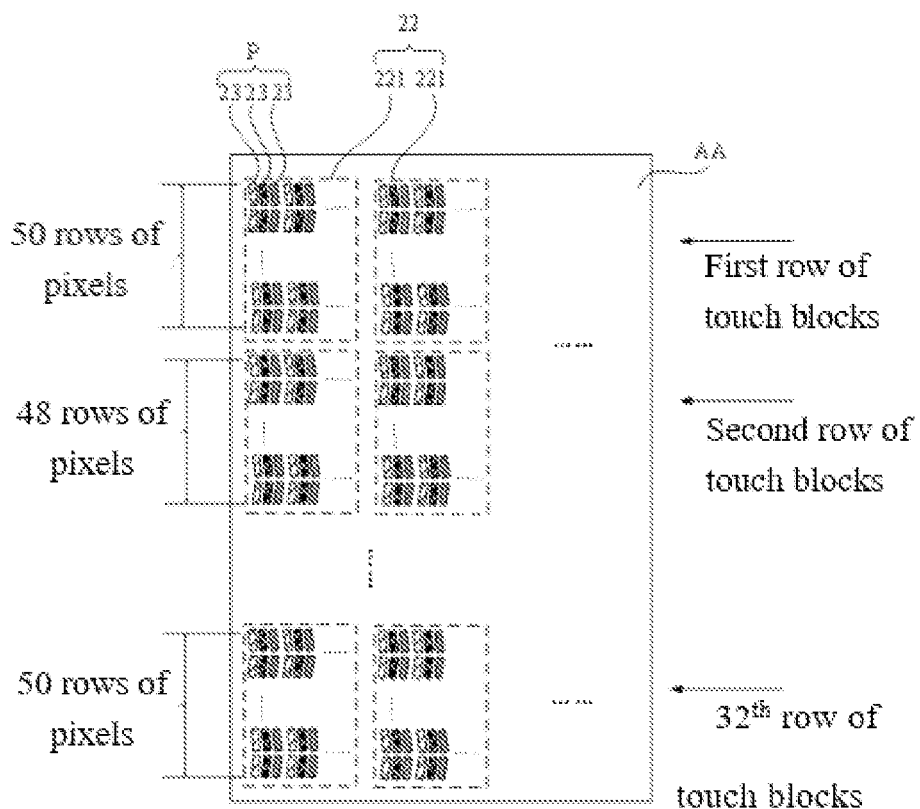
FIG. 9b schematically shows a fifth schematic diagram of the display substrate according to the embodiment of the present disclosure.

For example, FIG. 9b schematically shows a fifth schematic diagram of the display substrate according to the embodiment of the present disclosure. As shown in FIG. 9b, the display substrate has a resolution of 720*1520. 32 rows of touch units 221 may be arranged in the display substrate. In the first row of touch units 221 and the $32^{nd}$ row of touch units 221, each touch unit 221 covers 50 rows of sub-pixels 23. In the second to $31^{st}$ rows of touch units 221, each touch unit 221 covers 48 rows of sub-pixels 23. Optionally, 18 columns of touch units 221 may be provided in the display substrate, for example, each touch unit 221 may cover 40 columns of sub-pixels 23.

For example, the display substrate has a resolution of 720*1520. 32 rows of touch units 221 may be arranged in the display substrate. In the first to fourth rows of touch units 221, each touch unit 221 covers 46 rows of sub-pixels 23. In the $5^{th}$ to $28^{th}$ rows of touch units 221, each touch unit 221 covers 48 rows of sub-pixels 23. In the $29^{th}$ to $32^{nd}$ rows of touch units 221, each touch unit 221 covers 46 rows of sub-pixels 23. Optionally, 18 columns of touch units 221 may be provided in the display substrate, for example, each touch unit 221 may cover 40 columns of sub-pixels 23.

For example, the display substrate has a resolution of 720*1612. 32 rows of touch units 221 may be arranged in the display substrate. In the first to third rows of touch units 221, each touch unit 221 covers 52 rows of sub-pixels 23. In $4^{th}$ to $29^{th}$ rows of touch units 221, each touch unit 221 covers 50 rows of sub-pixels 23. In the $29^{th}$ to $32^{nd}$ rows of touch units 221, each touch unit 221 covers 52 rows of sub-pixels 23. Optionally, 18 columns of touch units 221 may be provided in the display substrate, for example, each touch unit 221 may cover 40 columns of sub-pixels 23.

For example, the display substrate has a resolution of 720*1680. 32 rows of touch units 221 may be arranged in the display substrate. In the first to fourth rows of touch unit 221, each touch unit 221 covers 54 rows of sub-pixels 23. In the $5^{th}$ to $28^{th}$ rows of touch units 221, each touch unit 221 covers 52 rows of sub-pixels 23. In $29^{th}$ to $32^{nd}$ rows of touch units 221, each touch unit 221 covers 54 rows of sub-pixels 23. Optionally, 18 columns of touch units 221 may be provided in the display substrate, for example, each touch unit 221 may cover 40 columns of sub-pixels 23.

In some embodiments, in the $(n+1)^{th}$ to $m^{th}$ rows of touch units 221, the number of rows of sub-pixels 23 covered by one row of two adjacent rows of touch units 221 is different the number of rows of sub-pixels 23 covered by the other row of the two adjacent rows of touch units 221.

Figure 9C:
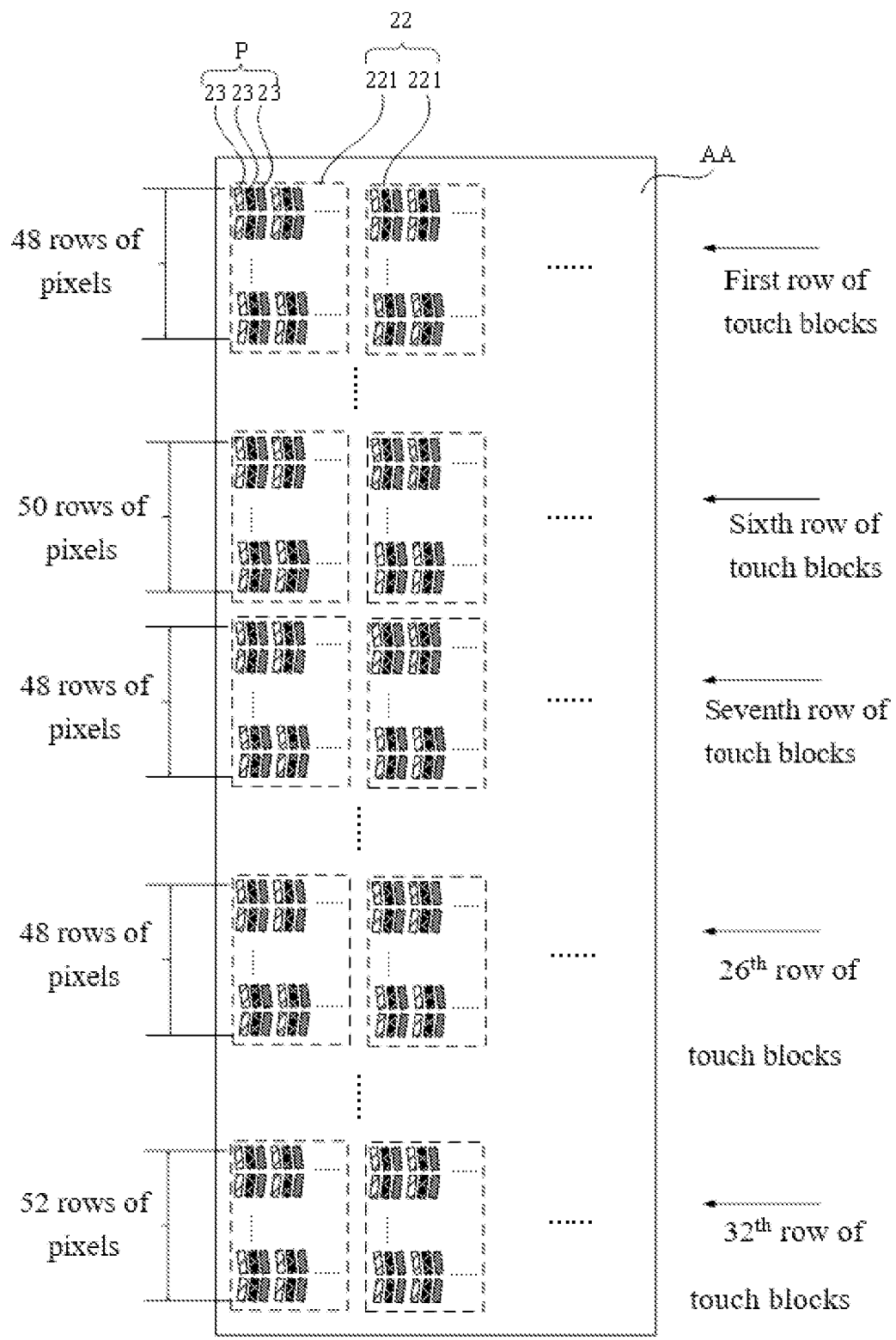
FIG. 9c schematically shows a sixth schematic diagram of the display substrate according to the embodiment of the present disclosure.

For example, FIG. 9c schematically shows a sixth schematic diagram of the display substrate according to the embodiment of the present disclosure. As shown in FIG. 9c, the display substrate has a resolution of 720*1560. 32 rows of touch units 221 may be arranged in the display substrate. In the first to fifth rows of touch units 221, each touch unit 221 covers 48 rows of sub-pixels 23. In the sixth to $24^{th}$ rows of touch units 221, the even-numbered row of touch units 221 cover 50 rows of sub-pixels 23. In the $7^{th}$ to $25^{th}$ rows of touch units 221, the odd-numbered row of touch units 221 cover 48 rows of sub-pixels 23. In the $26^{th}$ to $31^{st}$ rows of touch units 221, each touch unit 221 covers 48 rows of sub-pixels 23. In the $32^{nd}$ row of touch units 221, each touch unit 221 covers 52 rows of sub-pixels 23.

In some embodiments, the number of rows of sub-pixels 23 covered by the $N^{th}$ row of touch units 221 is different from the number of rows of sub-pixels 23 covered by other rows of touch units 221, so that the last row of touch units 221 may be arranged in a more flexible way, thereby enabling the touch unit 221 to meet the requirements such as special-shaped display in the display substrate.

In some embodiments, the number of columns of sub-pixels covered by each touch unit 221 is the same as the number of columns of sub-pixels covered by another touch unit 221. For example, each touch unit 221 covers 40 columns of sub-pixels 23.

Alternatively, in the $(m+1)^{th}$ to $N^{th}$ rows of touch units 221, the number of columns of sub-pixels 23 covered by at least one touch unit 221 in at least one row of touch units 221 is different from the number of columns of sub-pixels 23 covered by the touch unit 221 in any of the other rows.

For example, the display substrate adopts a resolution of 720*1612. 32 rows of touch units 221 may be arranged in the display substrate. In the first to fifth rows of touch units 221, each touch unit 221 covers 48 rows of sub-pixels 23. In the $6^{th}$ to $24^{th}$ rows of touch units 221, the even-numbered row of touch units 221 cover 48 rows of sub-pixels 23. In the $7^{th}$ to $25^{th}$ rows of touch units 221, the odd-numbered row of touch units 221 cover 50 rows of sub-pixels 23. In the $26^{th}$ to the $31^{st}$ rows of touch units 221, each touch unit 221 covers 48 rows of sub-pixels 23. In the $32^{nd}$ row of touch units 221, each touch unit 221 covers 52 rows of sub-pixels 23. Optionally, 18 columns of touch units 221 may be provided in the display substrate. For example, each of the touch units 221 other than the last row of touch units 221 in the display substrate covers 40 columns of sub-pixels 23, so that each of the touch units 221 in the last row covers 38 columns of sub-pixels 23.

In this way, a size of the touch unit 221 in the $N^{th}$ row may be adapted to the special-shaped structure, for example an opening hole provided for a camera etc., disposed at an edge of the display region AA.

In some embodiments, more than one touch units in at least one row of the $(m+1)^{th}$ to $N^{th}$ rows of touch units include at least one first touch unit and at least one second touch unit.

The orthographic projection of the first touch unit on the base substrate is different from the orthographic projection of the second touch unit on the base substrate. The number of columns of sub-pixels covered by the first touch unit is different from the number of columns of sub-pixels covered by the second touch unit, and the number of columns of sub-pixels covered by the first touch unit is different from the number of columns of sub-pixels covered by the touch unit in any other row of touch units.

For example, the orthographic projection of the first touch unit on the base substrate may be irregular (for example, non-rectangular), and the orthographic projection of the second touch unit on the base substrate may be similar to a rectangle, thereby facilitating to adapt the $N^{th}$ row of touch units 221 to the special-shaped structure disposed at the edge of the display region AA.

In some embodiments, the number of rows of sub-pixels covered by one of two adjacent rows of touch units is c, and the number of rows of sub-pixels covered by the other one of the two adjacent rows of touch units is d, wherein c is less than d, and the relationship between c and d satisfies:

$$\frac{c}{d} \geq 80\%.$$

In this way, in the embodiment of the present disclosure, the sizes of the touch units 221 in two adjacent rows may be adjusted within a certain range, so that the size of the touch units 221 may be set flexibly on a basis of ensuring that the pattern difference between adjacent two rows of touch units 221 would not be excessive.

In some embodiments, for the touch units 221 in two adjacent rows, an area of each touch unit 221 in one row of the two adjacent rows is large than e, and an area of each touch unit 221 in the other row of the two adjacent rows is large than f, wherein e is less than f, and a relationship between e and f satisfies:

$$\frac{e}{f} \geq 92\%.$$

For example, assuming that a reference area is q, the area of the touch unit 221 may be set in the range of 90%*q to 96%*q.

In some embodiments, the display substrate may be applied to current various display fields, which may be set as desired and is not limited herein. For example, the display substrate in the embodiment of the present disclosure may be applied in a field of virtual reality (Virtual Reality, VR for short) display and a field of augmented reality (Augmented Reality, AR for short) display.

The display substrate of the present disclosure may be an organic light emitting diode (OLED) display substrate, or a quantum dot light emitting diode (QLED) display substrate, or a sub-millimeter light emitting diode (mini LED) display substrate, or a micron light emitting diode (micro LED) display substrate, etc.

In the embodiment of the present disclosure, the display substrate may further include an encapsulation layer disposed on and covering the display substrate. For example, the encapsulation layer may include a first encapsulation sub-layer, a second encapsulation sub-layer, and a third encapsulation sub-layer that are sequentially disposed in a direction away from the base substrate. For example, the first encapsulation sub-layer and the third encapsulation sub-layer may be made of inorganic material(s), and the second encapsulation sub-layer may be made of organic material(s).

The encapsulation layer TFE may block water vapor and oxygen from invading the interior of the display substrate, so as to achieve the protection of the display substrate.

The present disclosure further provides a display device including the display substrate described above.

In other embodiments of the present disclosure, the examples of the display device include a tablet personal computer (PC), a smart phone, a personal digital assistant (PDA), a portable multimedia player, a game console, or a wristwatch electronic device, and the like. However, the embodiments of the present disclosure are not intended to limit the types of display devices. In some exemplary embodiments, the display device may be used not only in large electronic apparatus such as a television set (TV) or an external billboard, but also in a medium or a small electronic apparatus such as PC, a notebook computer, a car navigation device, or a camera.

Those skilled in the art will appreciate that various associations and/or combinations of features recited in various embodiments and/or claims of the present disclosure are possible, even if such associations or combinations are not expressly recited in the present disclosure. In particular, various associations and/or combinations of the features recited in the various embodiments of the present disclosure and/or in the claims may be made without departing from the spirit and teachings of the present disclosure. All of these associations and/or combinations fall within the scope of this disclosure.

Embodiments of the present disclosure have been described above. However, these embodiments are only for illustrative purposes, and are not intended to limit the scope of the present disclosure. Although the various embodiments are described above separately, it does not mean that the measures in the various embodiments may not be used advantageously in combination. The scope of the present disclosure is defined by the appended claims and their equivalents. Without departing from the scope of the present disclosure, those skilled in the art may make various substitutions and modifications, and all of these substitutions and modifications should fall within the scope of the present disclosure.

What is claimed is:

1. A display substrate comprising:
   a base substrate;
   a plurality of sub-pixels arranged in an array on the base substrate, wherein at least one of the plurality of sub-pixels comprises a first electrode, the first electrodes of the sub-pixels in one of two adjacent rows of sub-pixels extend in a first direction, and the first electrodes of the sub-pixels in the other one of the two adjacent rows of sub-pixels extend in a second direction intersecting with the first direction; and
   a touch electrode and a plurality of touch lines, wherein the touch electrode comprises a plurality of touch units, one of the plurality of touch units is connected to at least one of the plurality of touch lines, and different touch units are connected to different touch lines; and
   wherein each touch unit covers an even number of rows of sub-pixels;
   wherein the plurality of touch units are arranged in an array, and touch units in the same row cover the same number of rows of sub-pixels; and
   wherein the number of rows of sub-pixels covered by each of at least two rows of the touch units is different from the number of rows of sub-pixels covered by another one of at least two rows of the touch units.

2. The display substrate of claim 1, wherein the number of rows of sub-pixels covered by at least one row of first to $n^{th}$ rows of touch units is different from the number of rows of sub-pixels covered by at least one row of $(n+1)^{th}$ to $m^{th}$ rows of touch units; and/or,
   the number of rows of sub-pixels covered by at least one row of $(n+1)^{th}$ to $m^{th}$ rows of touch units is different from the number of rows of sub-pixels covered by at least one row of $(m+1)^{th}$ to a $N^{th}$ rows of touch units; and
   wherein N is a total number of the rows of touch units, each of m and n is an integer, and $1 \leq n < m < N$.

3. The display substrate of claim 2, wherein $$21\% \geq \frac{n}{m} \geq 2\%;$$

-continued and/or, $$16\% \geq \frac{n}{N} \geq 3\%;$$

and/or, $$97\% \geq \frac{m}{N} \geq 75\%.$$

4. The display substrate of claim 2, wherein the plurality of touch units satisfies:

y<x and y<z; or, y>x and y<z; or y>x and y>z;

wherein, x is the number of rows of sub-pixels covered by the at least one row of the first to $n^{th}$ rows of touch units, y is the number of rows of sub-pixels covered by the at least one row of the $(n+1)^{th}$ to $m^{th}$ rows of touch units, z is the number of rows of sub-pixels covered by the at least one row of the $(m+1)^{th}$ to $N^{th}$ rows of touch units.

5. The display substrate of claim 2, wherein the number of rows of sub-pixels covered by one of two adjacent rows of the $(n+1)^{th}$ to $m^{th}$ rows of touch units is different from the number of rows of sub-pixels covered by the other one of the two adjacent rows of the $(n+1)^{th}$ to $m^{th}$ rows of touch units.

6. The display substrate of claim 2, wherein the number of columns of sub-pixels covered by each touch unit is the same as the number of columns of sub-pixels covered by another touch unit; or, the number of columns of sub-pixels covered by at least one touch unit in at least one row of the $(m+1)^{th}$ to $N^{th}$ rows of the touch units is different from the number of columns of sub-pixels covered by the touch unit in any other row of the $(m+1)^{th}$ to $N^{th}$ rows of touch units.

7. The display substrate of claim 6, wherein more than one touch units in at least one row of the (m+1)th to Nth rows comprise:

at least one first touch unit and at least one second touch unit, an orthographic projection of the first touch unit on the base substrate is different from an orthographic projection of the second touch unit on the base substrate; wherein the number of columns of sub-pixels covered by the first touch unit is different from the number of columns of sub-pixels covered by the second touch unit, and the number of columns of sub-pixels covered by the first touch unit is different from the number of columns of sub-pixels covered by the touch unit in any other row of touch units.

8. The display substrate of claim 2, wherein the number of rows of sub-pixels covered by the Nth row of touch units is different from the number of rows of the sub-pixels covered by any other row of touch units.

9. The display substrate of claim 1, wherein the number of rows of sub-pixels covered by one of two adjacent rows of touch units is c, and the number of rows of sub-pixels covered by the other one of the two adjacent rows of touch units is d, wherein c is less than d, and $$\frac{c}{d} \geq 80\%.$$

10. The display substrate of claim 1, wherein the first electrode of at least one sub-pixel comprises a plurality of strip electrodes, and the plurality of strip electrodes of the same sub-pixel extend in substantially the same direction;

wherein at least one touch unit comprises a plurality of touch blocks, each touch block corresponds to at least one sub-pixel, and different touch blocks correspond to different sub-pixels; the touch block is multiplexed as a second electrode of the sub-pixel corresponding to the touch block, wherein the first electrode and the second electrode form a driving electrode of the sub-pixel; and wherein the touch block is in form of a flat plate;

wherein a preset angle is formed between the first direction and the second direction, such that: the drive electrodes of the sub-pixels in one of two adjacent rows of sub-pixels are allowed to form a first domain electric field, and the driving electrodes of the sub-pixels in the other one of the two adjacent rows of sub-pixels are allowed to form a second domain electric field, wherein a direction of the first domain electric field is different from a direction of the second domain electric field.

11. The display substrate of claim 10, wherein the plurality of sub-pixels form a plurality of pixel units, one pixel unit comprising more than one sub-pixels in different colors; the plurality of touch blocks in a same touch unit are divided into a plurality of groups, at least one group comprising more than one touch blocks, wherein the sub-pixels corresponding to the touch blocks in at least one group belong to a same pixel unit, and the touch blocks in a same group are connected to each other;

wherein different groups of touch blocks are spaced by an interval, and the touch blocks belonging to different groups in a same touch unit are connected to each other by a first connection part;

wherein the groups of touch blocks connected to the first connection part are arranged surrounding the first connection part.

12. The display substrate of claim 1, wherein the display substrate further comprises a plurality of gate lines extending in a row direction, one row of sub-pixels are connected to one gate line, the touch electrode further comprises a plurality of rows of first hollow structures, at least one row of first hollow structures corresponds to at least one gate line, and different rows of first hollow structures correspond to different gate lines; and an orthographic projection of at least one row of first hollow structures on the base substrate at least partially overlaps with an orthographic projection of the gate line corresponding to the at least one row of first hollow structures on the base substrate;

wherein at least one sub-pixel further comprises a thin film transistor connected to a data line; the touch electrode further comprises a plurality of second hollow structures, at least one second hollow structure corresponds to at least one sub-pixel, different second hollow structures correspond to different sub-pixels, and an orthographic projection of at least one second hollow structure on the base substrate at least partially overlaps with an orthographic projection of the thin film transistor of the sub-pixel corresponding to the second hollow structure on the base substrate;

wherein the thin film transistor comprises a semiconductor layer and a gate layer; the semiconductor layer comprises a first electrode connection part, a second electrode connection part and a channel part disposed between the first electrode connection part and the second electrode connection part, the channel part is disposed directly opposite to the gate layer, and the channel part is in form of a straight line.

13. The display substrate of claim 1, wherein the display substrate further comprises a plurality of data lines extending in a column direction, and one column of the sub-pixels are connected to the same data line;

the sub-pixel comprises a first side and a second side opposite to the first side, and an orthographic projection of at least one of the plurality of data lines on the base substrate is on the first side of an orthographic projection of the sub-pixels connected to at least one of the plurality of the data lines on the base substrate;

at least one of the plurality of data lines comprises a plurality of segments, at least one of the plurality of segments comprises a first part corresponding to an odd numbered row of sub-pixels and a second part corresponding to an even numbered row of sub-pixels, a direction along which the first part extends is substantially the same as a direction along which the first electrodes of the sub-pixels corresponding to the first part extend, and a direction along which the second part extends is substantially the same as a direction along which the first electrodes of the sub-pixels corresponding to the second part extend; and two adjacent segments of at least one of the plurality of data lines are connected to each other by a second connection part, the second connection part is bended in a third direction directing from the second side of the sub-pixel to the first side of the sub-pixel.

14. The display substrate of claim 1, wherein at least one of the touch unit comprises a plurality of touch blocks, the plurality of sub-pixels comprise a plurality of first sub-pixels capable of displaying a first color, the plurality of touch blocks in at least one touch unit comprise a plurality of first touch blocks, at least one first touch block corresponds to at least one first sub-pixel, and different first touch blocks correspond to different first sub-pixels;

at least one touch line comprises a body part and a plurality of protrusions on a side of the body part, the plurality of protrusions are arranged along a length direction of the touch line, at least one protrusion corresponds to at least one first touch block, different protrusions correspond to different first touch blocks, and an orthographic projection of at least one protrusion on the base substrate at least partially overlaps with an orthographic projection of the first touch block corresponding to the at least one protrusion on the base substrate.

15. The display substrate of claim 14, wherein the touch electrode further comprises a plurality of columns of third hollow structures, at least one column of third hollow structures corresponds to at least one touch line, and different columns of third hollow structures correspond to different touch lines;

at least one column of third hollow structures comprises: a plurality of second hollow parts spaced from each other and arranged in a direction along which the third hollow structures extend, and a third hollow part disposed on a side of at least one second hollow part;

at least one third hollow part corresponds to at least one protrusion of the touch line corresponding to the at least one third hollow part, and different third hollow parts correspond to different protrusions;

an orthographic projection of at least one third hollow part on the base substrate at least partially overlaps with an orthographic projection of the protrusion corresponding to the at least one third hollow part on the base substrate; and an orthographic projection of at least one second hollow part on the base substrate at least partially overlaps with an orthographic projection of the body part of the touch line corresponding to the at least one second hollow part on the base substrate.

16. The display substrate of claim 15, wherein the display substrate further comprises a plurality of gate lines extending in a row direction, and one row of sub-pixels are connected to the same gate line;

the touch electrode further comprises a plurality of rows of first hollow structures, at least one row of first hollow structures corresponds to at least one gate line, different rows of first hollow structures correspond to different gate lines; an orthographic projection of at least one first hollow structure on the base substrate at least partially overlaps with an orthographic projection of the gate line corresponding to the at least first hollow structure on the base substrate; and for at least one column of third hollow structures, a $j^{th}$ third hollow structure is connected to the first hollow structure and spaced from the second hollow part, and a $(j+1)^{th}$ third hollow structure is spaced from the first hollow structure and connected to the second hollow structure, wherein j is a positive integer.

17. The display substrate of claim 14, wherein the touch line is disposed on a side of the touch block close to the base substrate; the first touch blocks in at least one touch unit are arranged in an array, at least one first touch block in at least one column of first touch blocks in the touch unit is connected to the protrusion corresponding to the at least one first touch block through a via hole;

wherein one of the first touch blocks in two adjacent rows is connected to the protrusion corresponding to the one of the first touch blocks through a via hole;

wherein the first sub-pixel is a blue sub-pixel;

wherein the first electrode of at least one sub-pixel comprises a plurality of strip electrodes; a length of at least one strip electrode of at least one first sub-pixel is less than a length of the plurality of strip electrodes of any other sub-pixel;

wherein the plurality of sub-pixels are divided into a plurality of groups, at least one group of sub-pixels comprises two adjacent rows of sub-pixels, and sub-pixels in different groups belong to different rows.

18. A display panel comprising a display substrate of claim 1.

19. A display device comprising a display panel of claim 18.

20. The display substrate of claim 1, wherein an area of each touch unit in one of two adjacent rows of touch units is large than e, an area of each touch unit in the other one of the two adjacent rows of touch units is large than f, wherein e is less than f, and 92%.

* * * * *